US012480647B2

(12) United States Patent
Bhutani et al.

(10) Patent No.: US 12,480,647 B2
(45) Date of Patent: *Nov. 25, 2025

(54) CONTROL MODULE FOR A LIGHTING FIXTURE

(71) Applicant: Lutron Technology Company LLC, Coopersburg, PA (US)

(72) Inventors: Ankit Bhutani, Aston, PA (US); Richard S. Camden, Coopersburg, PA (US); Kevin L. Gascho, Bethlehem, PA (US); Stephen Phillips, Melrose, MA (US); Kevin Millner, Boynton Beach, FL (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/784,088

(22) Filed: Jul. 25, 2024

(65) Prior Publication Data

US 2024/0377052 A1 Nov. 14, 2024

Related U.S. Application Data

(63) Continuation of application No. 17/970,859, filed on Oct. 21, 2022, now Pat. No. 12,092,304.

(Continued)

(51) Int. Cl.
*F21V 23/00* (2015.01)
*F21V 23/04* (2006.01)
(Continued)

(52) U.S. Cl.
CPC .......... *F21V 23/009* (2013.01); *F21V 23/006* (2013.01); *F21V 23/0435* (2013.01);
(Continued)

(58) Field of Classification Search
CPC .. F21V 23/009; F21V 23/006; F21V 23/0435; F21V 23/0471; H05B 47/19;
(Continued)

(56) References Cited

U.S. PATENT DOCUMENTS 7,940,167 B2 5/2011 Steiner et al.
8,199,010 B2 6/2012 Sloan et al.
(Continued)

FOREIGN PATENT DOCUMENTS

DE 102019131487 A1 5/2021

*Primary Examiner* — Christopher E Dunay
(74) *Attorney, Agent, or Firm* — Philip N. Smith; Glen R. Farbanish; Michael S. Czarnecki

(57) ABSTRACT

A control module configured to be mounted in a fixture opening of a lighting fixture may comprise an antenna (e.g., a dipole antenna) having a majority of primary radiating structures located outside of the lighting fixture when mounted to the lighting fixture. The control module may comprise a detector positioned to receive infrared energy through a lens for detecting occupancy or vacancy conditions. The antenna may comprise two elements electrically connected in a dipole antenna configuration and comprising respective curved portions that are positioned to curve around the detector outside of the lighting fixture. The control module may comprise an enclosure comprising clips that each have teeth for attaching the control module within the fixture opening. The clips may be located adjacent to each other and the teeth may be staggered relative to each other, such that one tooth of either clip engages the fixture opening at a single time.

20 Claims, 15 Drawing Sheets

Related U.S. Application Data

(60) Provisional application No. 63/341,687, filed on May 13, 2022, provisional application No. 63/270,896, filed on Oct. 22, 2021.

(51) Int. Cl.
*H05B 47/13* (2020.01)
*H05B 47/19* (2020.01)
*H05K 9/00* (2006.01)
*G01J 5/00* (2022.01)
*H05B 47/115* (2020.01)
*H05K 1/14* (2006.01)

(52) U.S. Cl.
CPC ......... *F21V 23/0471* (2013.01); *H05B 47/13* (2020.01); *H05B 47/19* (2020.01); *H05K 9/0024* (2013.01); *G01J 5/0025* (2013.01); *H05B 47/115* (2020.01); *H05K 1/148* (2013.01)

(58) Field of Classification Search
CPC .... H05B 47/13; H05B 47/115; H05K 9/0024; H05K 1/148; G01J 5/0025
See application file for complete search history.

(56) References Cited

U.S. PATENT DOCUMENTS

| | | | |
|---|---|---|---|
| 8,228,184 B2 | 7/2012 | Blakeley et al. | |
| 10,935,228 B2* | 3/2021 | Bocock | F21V 29/70 |
| 11,108,151 B1* | 8/2021 | Santhakumar | G08B 25/10 |
| 11,824,256 B2 | 11/2023 | Pearson et al. | |
| 2015/0338077 A1 | 11/2015 | Johnson | |
| 2016/0047537 A1* | 2/2016 | Stolte | H05B 47/19 |
| | | | 362/276 |
| 2016/0255705 A1 | 9/2016 | Sagal et al. | |
| 2018/0077779 A1 | 3/2018 | Johnson | |
| 2018/0103411 A1 | 4/2018 | Greene et al. | |
| 2018/0249563 A1 | 8/2018 | Alexander | |
| 2023/0151953 A1 | 5/2023 | Bhutani et al. | |

* cited by examiner

CONTROL MODULE FOR A LIGHTING FIXTURE

CROSS-REFERENCE TO RELATED APPLICATIONS

This application is a continuation of U.S. Non-Provisional application Ser. No. 17/970,859, filed Oct. 21, 2022; which claims the benefit of U.S. Provisional Patent Application No. 63/270,896, filed Oct. 22, 2021, and U.S. Provisional Patent Application No. 63/341,687, filed May 13, 2022, the entire disclosures of which are hereby incorporated by reference.

BACKGROUND

A user environment, such as a residence or an office building for example, may be configured using various types of load control systems. A lighting control system may be used to control the lighting loads in the user environment. A motorized window treatment control system may be used to control the natural light provided to the user environment. A heating, ventilation, and air-conditioning (HVAC) system may be used to control the temperature in the user environment.

Each load control system may include various control devices, including input devices and load control devices. The load control devices may receive digital messages, which may include load control instructions, for controlling an electrical load from one or more of the input devices. The load control devices may receive the digital messages via radio frequency (RF) signals. Each of the load control devices may be capable of directly controlling an electrical load. The input devices may be capable of indirectly controlling the electrical load via digital messages transmitted to the load control device.

SUMMARY

As described herein, a control module configured to be mounted in a fixture opening of a housing of a lighting fixture may comprise an antenna (e.g., a dipole antenna) having a majority of primary radiating structures located outside of the lighting fixture when mounted to the lighting fixture. The control module may comprise an enclosure defining a central axis extending in a longitudinal direction and configured to be received in the fixture opening of the lighting fixture, and a cover portion connected to the enclosure and covering an enclosure opening at a first end of the enclosure. The control module may also comprise at least one printed circuit board housed within the enclosure and having a control circuit and a wireless communication circuit mounted thereto, and a detector positioned to receive infrared energy through a lens in an aperture of the cover portion. The detector may be electrically coupled to the control circuit such that the control circuit is configured to detect at least one of an occupancy or vacancy condition in a space surrounding the control module. The antenna of the control module may comprise first and second antenna elements electrically connected to the wireless communication circuit in a dipole antenna configuration. Each of the first and second antenna elements may extend from the at least one printed circuit board to respective curved portions that are positioned between the cover portion and the enclosure and curve around the detector. The control circuit may be configured to cause the wireless communication circuit to communicate messages in wireless signals via the antenna.

The detector may comprise one or more pyroelectric elements that are responsive to the infrared energy and a housing having a front surface with a first opening through which the pyroelectric elements receive the infrared energy. The detector may be located at a point where energy of the wireless signals transmitted by the antenna is at a maximum level. The housing of the detector may be electrically conductive and may be coupled to a circuit common of the control module. The opening of the housing of the detector may be sized to shield the pyroelectric elements from wireless signals transmitted by the antenna in response to the wireless communication circuit. In addition, the detector may comprise a shield located over the front surface of the housing of the detector. The shield may have an opening arranged overtop of the opening of the housing and may be electrically coupled to circuit common of the control module. When the housing of the detector is electrically conductive and coupled to circuit common of the control module, the shield may be electrically connected to the housing of the detector and circuit common. When the housing of the detector is not electrically conductive, the shield may comprise a conductive strap configured to be coupled to circuit common of the control module. The opening of the shield being sized to shield the pyroelectric elements from the wireless signals transmitted by the antenna in response to the wireless communication circuit.

In addition, the enclosure may comprise first and second clips configured to mount the control module within the fixture opening. The first and second clips may be located adjacent to each other. Each of the first and second clips may comprise a plurality of teeth configured to engage a structure surrounding the fixture opening. The teeth of the first and second clips may be staggered relative to each other, such that one tooth of the first clip or the second clip is configured to engage the fixture opening at a single time. As the control module is inserted into the fixture opening, a first tooth of the first clip may be configured to engage the structure surrounding the fixture opening first, a second tooth of the second clip may be configured to engage the structure surrounding the fixture opening after the first tooth, a third tooth of the first clip may be configured to engage the structure surrounding the fixture opening after the second tooth, and a fourth tooth of the second clip may be configured to engage the structure surrounding the fixture opening after the third tooth. The first clip may comprise a first number of teeth and the second clip may comprise a second number of teeth, such that the control module is configured to be installed in the fixture opening at a third number of distinct depths of insertion, where the third number is equal to the first number plus the second number.

Further, the at least one printed circuit board of the control module may comprise one or more attachment tabs extending from sides of the at least one printed circuit board. The one or more attachment tabs may be configured to attach the at least one printed circuit board to a fabrication panel during manufacturing of the control module. After the at least one printed circuit board is detached from the fabrication panel, the one or more attachment tabs are configured to be received within gaps in the enclosure of the control module to align the at least one printed circuit board within the enclosure. In some examples, the detector and/or the antenna and wireless communication circuit may be omitted from the control module.

DETAILED DESCRIPTION

Figure 1:
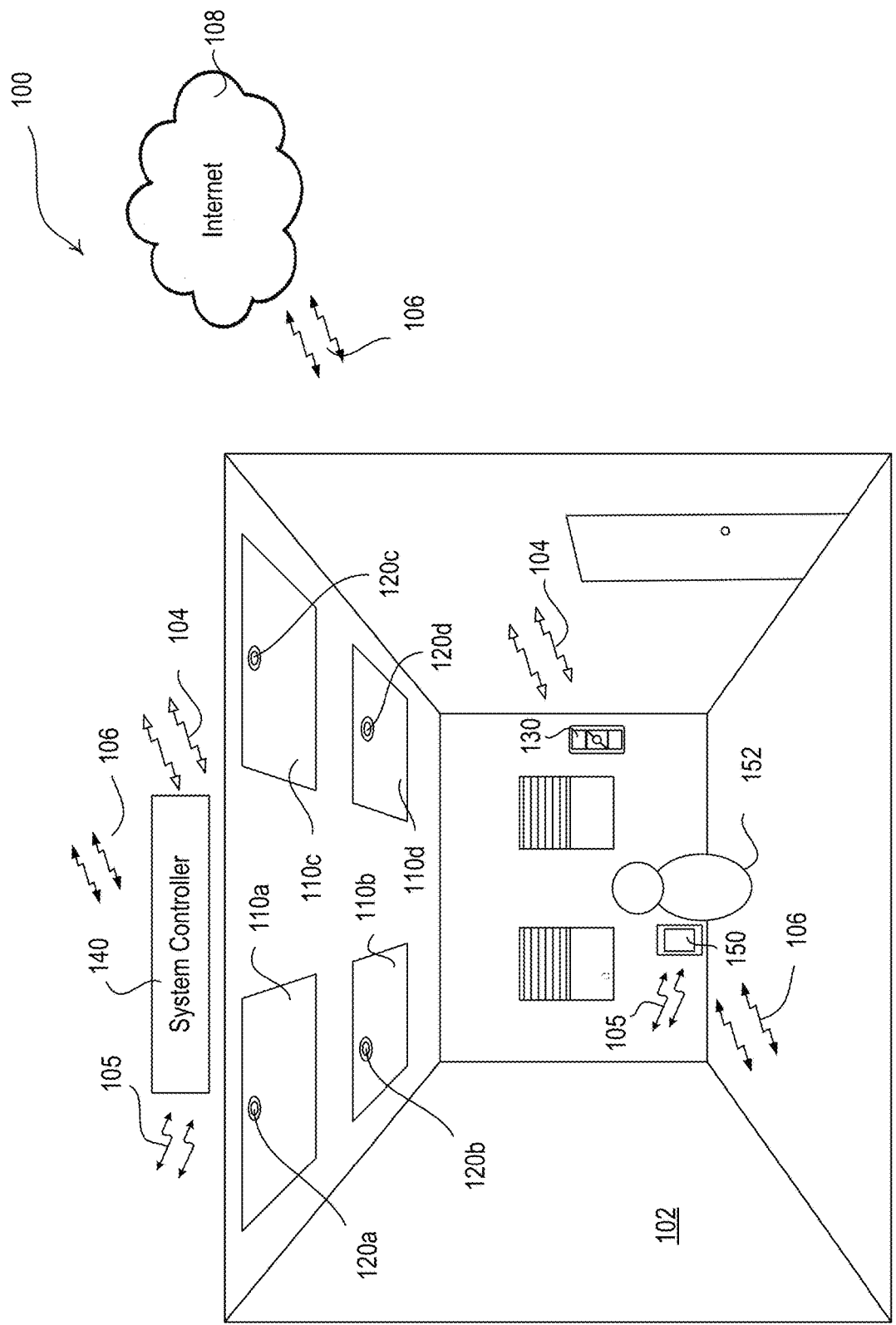
FIG. 1 is a diagram of an example load control system.

FIG. 1 is a diagram of an example load control system 100 for controlling the amount of power delivered from an alternating-current (AC) power source (not shown) to one or more electrical loads. The load control system 100 may be installed in a load control environment, such as a room 102 of a building. The load control system 100 may comprise a plurality of control devices configured to communicate with each other via wireless signals, e.g., radio-frequency (RF) signals 104, 105. For example, the control-source devices, control-target devices, and/or the system controller 110 may be configured to transmit and receive the RF signals 104, 105. The RF signals 104, 105 may use a proprietary RF protocol, such as the CLEAR CONNECT protocol (e.g., the CLEAR CONNECT TYPE A protocol and/or the CLEAR CONNECT TYPE X protocol). Alternatively, the RF signals 104, 105 may be transmitted using a different RF protocol, such as, a standard protocol, for example, one of WI-FI, BLUETOOTH, BLUETOOTH LOW ENERGY (BLE), ZIGBEE, Z-WAVE, THREAD, KNX-RF, ENOCEAN RADIO protocols, or a different standard or proprietary protocol. Alternatively or additionally, the load control system 100 may comprise a wired digital communication link coupled to one or more of the control devices to provide for communication between the control devices.

The control devices of the load control system 100 may comprise a number of control-source devices (e.g., input devices operable to transmit messages in response to receiving user inputs, detecting occupancy/vacancy conditions, measuring ambient light intensity level, etc.) and a number of control-target devices (e.g., load control devices operable to receive messages and control electrical loads in response to the received messages). A single control device of the load control system 100 may operate as both a control-source and a control-target device. For example, the control-source device may be an originating device or intermediary device from which a message is originated and a control-target device may be a destination device or intermediary device to which the message is transmitted.

The lighting control system 100 may comprise one or more lighting fixtures 110a, 110b, 110c, 110d that may be installed in the room 102 (e.g., in the ceiling of the room). Each lighting fixture 110a-110d may include a lighting load (e.g., an LED light source) and a respective lighting control device (e.g., an LED driver, ballast, dimming or switching module, or any combination of such devices) for controlling the respective lighting load of the lighting fixture 110a-110d. The lighting control devices may be control-target devices capable of controlling a respective lighting load in response to control instructions received in digital messages.

The control-source devices of the load control system 100 may be used to control the lighting fixtures 110a-110d. The control-source devices may be input devices capable of communicating messages (e.g., digital messages) to the control-target devices of the load control system 100, such as the lighting control devices in the lighting fixtures 110a-110d, e.g., via the RF signals 104, 105. The control-source devices may transmit the messages for controlling (e.g., indirectly controlling) the amount of power provided to the lighting loads by the respective lighting control devices in the respective lighting fixtures 110a-110d. The messages may include control instructions (e.g., load control instructions) or another indication that causes the lighting control devices to determine load control instructions for controlling the respective lighting loads. The control-sources devices of the load control system 100 may comprise, for example, a remote control device 130, which may be configured to transmit messages to the lighting control devices in the respective lighting fixture 110a-110d via the RF signals 104 in response to actuations of one or more buttons of the remote control device 130. For example, the remote control device 130 may be battery-powered.

The load control system 100 may include control modules (e.g., sensor devices and/or fixture controllers), such as control modules 120a, 120b, 120c, 120d. The control modules 120a-120d may each be attached to one of the lighting fixture 110a-110d. The control modules 120a-120d may each be electrically connected to a respective lighting control device within the lighting fixtures 110a-110d for controlling lighting loads. The control modules 120a-120d may include one or more sensors (e.g., sensing circuits) for controlling the lighting loads within the respective lighting fixtures 110a-110d. For example, the control modules 120a-120d may include an occupancy sensing circuit (e.g., may operate as an occupancy sensor) and/or a daylight sensing circuit (e.g., may operates as a daylight sensor). The control modules 120a-120d may be control-source devices that transmit digital messages to respective lighting control devices to which they are connected (e.g., on a wired communication link). The control modules 120a-120d may also, or alternatively, be control-target devices for receiving digital messages from other devices in the system, such as the remote control device 130 or another control-source device, (e.g., on a wireless communication link via the RF signals 104, 105) for controlling the respective lighting control devices to which the control modules 120a-120d are connected.

The occupancy sensing circuit in the control modules 120a-120d may be configured to detect occupancy and/or vacancy conditions in the room 102 in which the load control system 100 is installed. The control modules 120a-120d may control the lighting control devices in the respective lighting fixtures 110a-110d in response to the occupancy sensors detecting the occupancy or vacancy conditions. The control modules 120a-120d may each also operate as a vacancy sensor, such that messages are transmitted in response to detecting a vacancy condition (e.g., messages may not be transmitted in response to detecting an occupancy condition). The daylight sensing circuit in the control modules 120a-120d may be configured to measure an ambient light intensity level in the visible area of the room 102 in which the load control system 100 is installed. The control modules 120a-120d may control the lighting control devices in the respective lighting fixture 110a-121d in response to the ambient light intensity level measured by the respective daylight sensing circuit.

The control modules 120a-120d may each comprise a memory or other computer-readable storage medium capable of storing instructions thereon for being executed by the control circuit. Each control module 120a-120d may store in the memory unique identifiers of other devices in the load control system 100 with which the control module is associated to enable recognition of messages from and/or transmission of messages to associated control devices. For example, each control module 120a-120d may store in the memory the unique identifier of the remote control device 130 with which the control module is associated.

The control modules 120a-120d may each comprise one or more wireless communication circuits for transmitting and/or receiving messages, e.g., via the RF signals 104, 105. A first wireless communication circuit of each of the control modules 120a-120d may be capable of communicating on a first wireless communication link (e.g., a wireless network communication link) and/or communicating using a first wireless protocol (e.g., a wireless network communication protocol, such as the CLEAR CONNECT and/or THREAD protocols) via the RF signals 104. A second wireless communication circuit of each of the control modules 120a-120d may be capable of communicating on a second wireless communication link (e.g., a short-range wireless communication link) and/or communicating using a second wireless protocol (e.g., a short-range wireless communication protocol, such as the BLUETOOTH and/or BLUETOOTH LOW ENERGY (BLE) protocols) via the RF signals 105.

The control modules 120a-120d may each comprise one or more wired communication circuits for transmitting and/or receiving signals and/or messages via respective wired communication links. For example, each control module 120a-120d may transmit and/or receive messages via the wired communication circuit on a wired power/communication link in the respective lighting fixture 110a-110d. The wired power/communication link may be used for providing communications and/or power within each of the lighting fixtures 110a-110d. For example, the wired power/communication link may comprise, for example, a Digital Addressable Lighting Interface (DALI) link or another digital communication link. The wired power/communication link in each lighting fixture 110a-110d may be used by the respective control module 120a-120d to transmit messages (e.g., including commands) to the respective lighting control devices for controlling an intensity level and/or color (e.g., color temperature) of the respective lighting loads. Each control module 120a-120d may receive messages (e.g., including feedback information) from the respective lighting control device that indicate the intensity level and/or color of the respective lighting loads. In addition, the lighting control devices in each of the lighting fixtures 110a-110d may each receive power from an AC power source (not shown) and may each supply power to the respective control module 120a-120d via the wired power/communication link 120. Though the wired power/communication link may be described herein as a single link, the wired power/communication link may be comprised of multiple links. For example, the lighting control devices of each lighting fixture 110a-110d may provide power to the respective control module 120a-120d via a two-wire power bus, while communications may be performed between the control module and the lighting control devices 124 using an analog communication link, such as a 0-10V control link or another communication link through which power may not be provided (e.g., an RS-485 digital communication link).

The load control system 100 may include a system controller 140 that is configured to transmit and/or receive messages via wired and/or wireless communications. For example, the system controller 140 may be configured to transmit and/or receive the RF signals 104, to communicate with one or more control devices (e.g., control-source devices and/or control-target devices, such as the control modules 120a-120d). The system controller 140 may communicate digital messages between associated control devices. The system controller 140 may be coupled to one or more wired control devices (e.g., control-source devices and/or control-target devices) via a wired digital communication link. The system controller 140 may also, or alternatively, be capable of communicating on a third wireless communication link (e.g., a standard communication link) and/or communicating using a third wireless protocol (e.g., a standard communication protocol, such as the Internet protocol (IP) and/or WI-FI protocol), via RF signals 106. For example, the system controller 140 may be configured to transmit and/or received messages on a network 108, such as the Internet, via the RF signals 106.

The system controller 140 may be configured to transmit and receive messages between control devices. For example, the system controller 140 may transmit messages to the control modules 120a-120d for controlling the lighting loads in the lighting fixtures 110a-110d in response to the messages received from the remote control device 130 (e.g., via the RF signals 104). The messages may include configuration data for configuring the control devices (e.g., the control modules 120a-120d) and/or control data (e.g., commands) for controlling the lighting loads in the lighting fixtures 110a-110d.

The load control system 100 may be commissioned to enable control of the lighting loads in the lighting fixtures 110a-110d based on commands communicated from the control devices (e.g., the remote control device 130) to the control modules 120a-120d for controlling the lighting loads in the lighting fixtures 110a-110d. For example, the remote control device 130 may be associated with the control modules 120a-120d within the lighting fixtures 110a-110d. Association information may be stored on the associated devices, which may be used to communicate and identify messages and/or commands at associated devices for controlling electrical devices in the load control system 100. The association information may include the unique identifier of one or more of the associated devices. The association information may be stored at the control modules 120a-120d, the system controller 140, or at other control devices that may be implemented to enable communication and/or identification of messages between the control devices.

A network device 150 may be in communication with the control modules 110a-110d and/or the system controller 140 for commissioning and/or controlling the control devices of the load control system 100. The network device 150 may comprise a wireless phone, a tablet, a laptop, a personal digital assistant (PDA), a wearable device (e.g., a watch, glasses, etc.), or other computing device. The network device 150 may be operated by a user 152. The network device 150 may be configured to communicate with the system controller 140 and/or control devices connected to the network 108 by transmitting and/or receiving messages using a standard wireless protocol (e.g., via the RF signals 108). In addition, the network device 150 may be configured to communicate with the control modules 110a-110d by transmitting and/or receiving messages via the short-range wireless communication link (e.g., using the RF signals 106). Further, the network device 150 may be configured to transmit and/or receive beacon signals that may be used to commission the load control system 100 via the short-range wireless communication link (e.g., using the RF signals 106).

Figure 2:
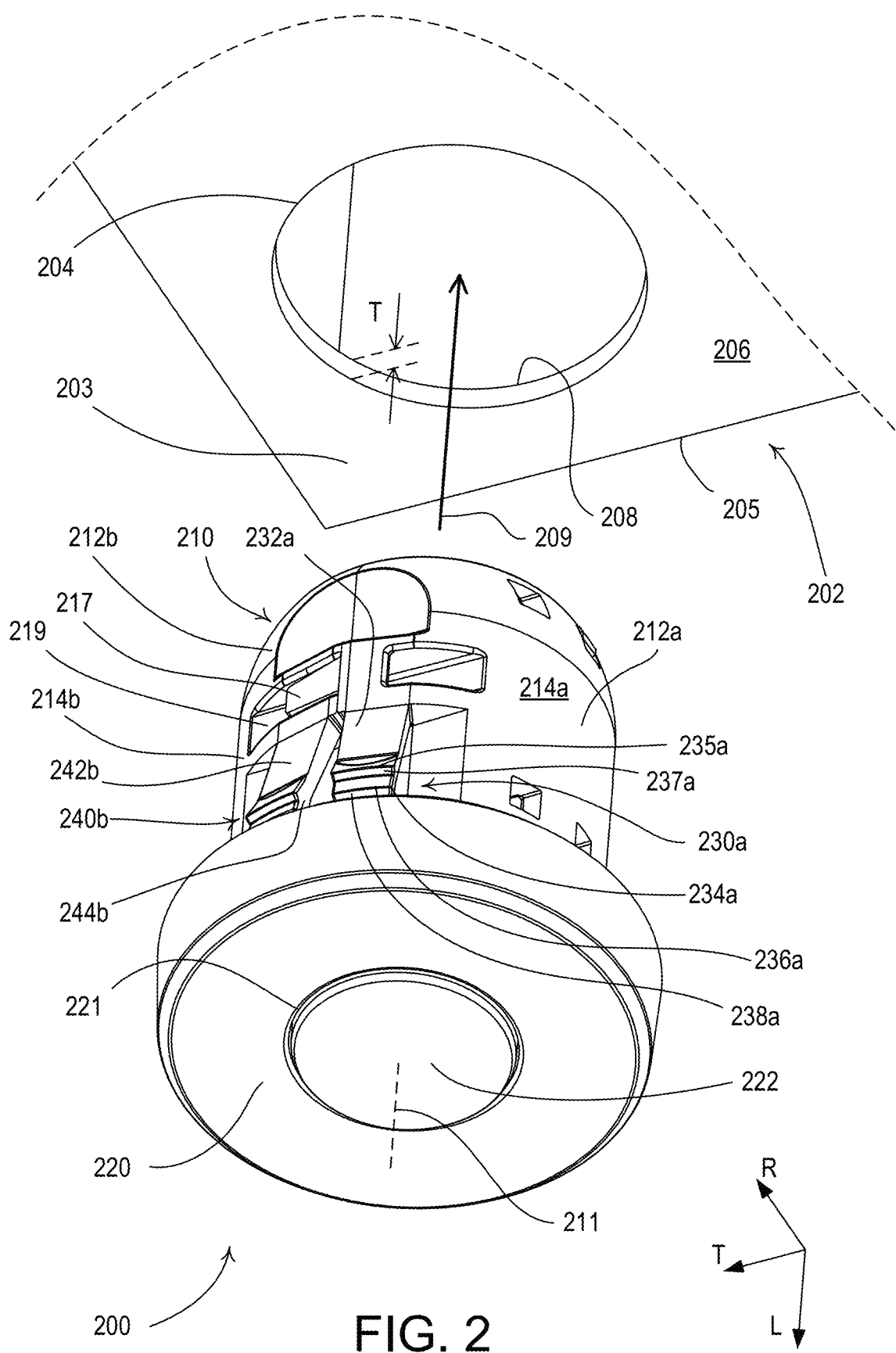
FIGS. 2 and 3 are perspective views depicting an example control module (e.g., sensor module) that may be installed in a lighting fixture of the load control system of FIG. 1.
Figure 3:
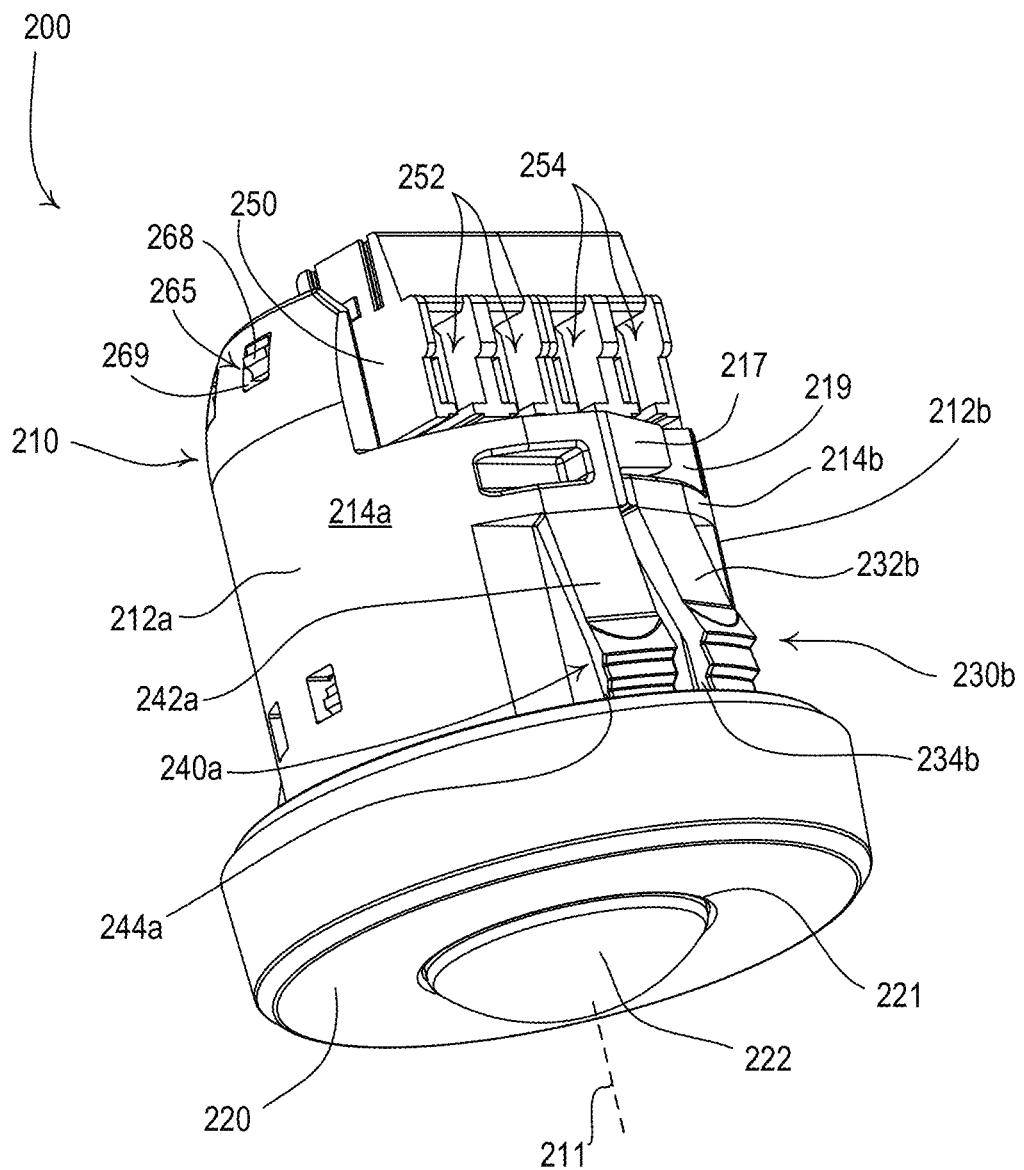
Figure 3:
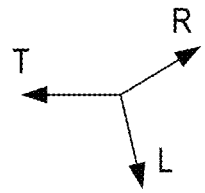
Figure 4:
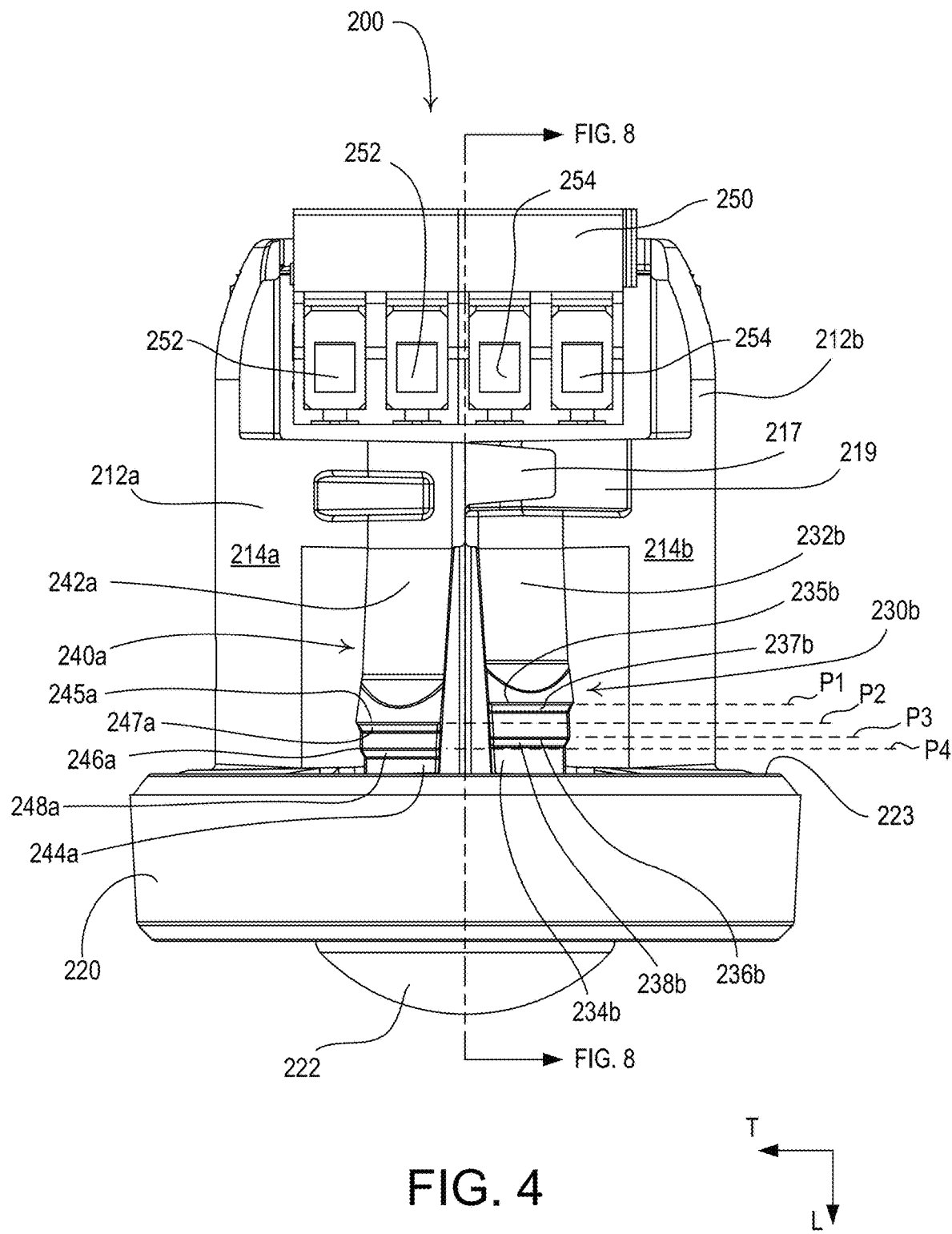
FIG. 4 is a radial side view of the control module of FIG. 2 (e.g., looking in a radial direction).
Figure 5:
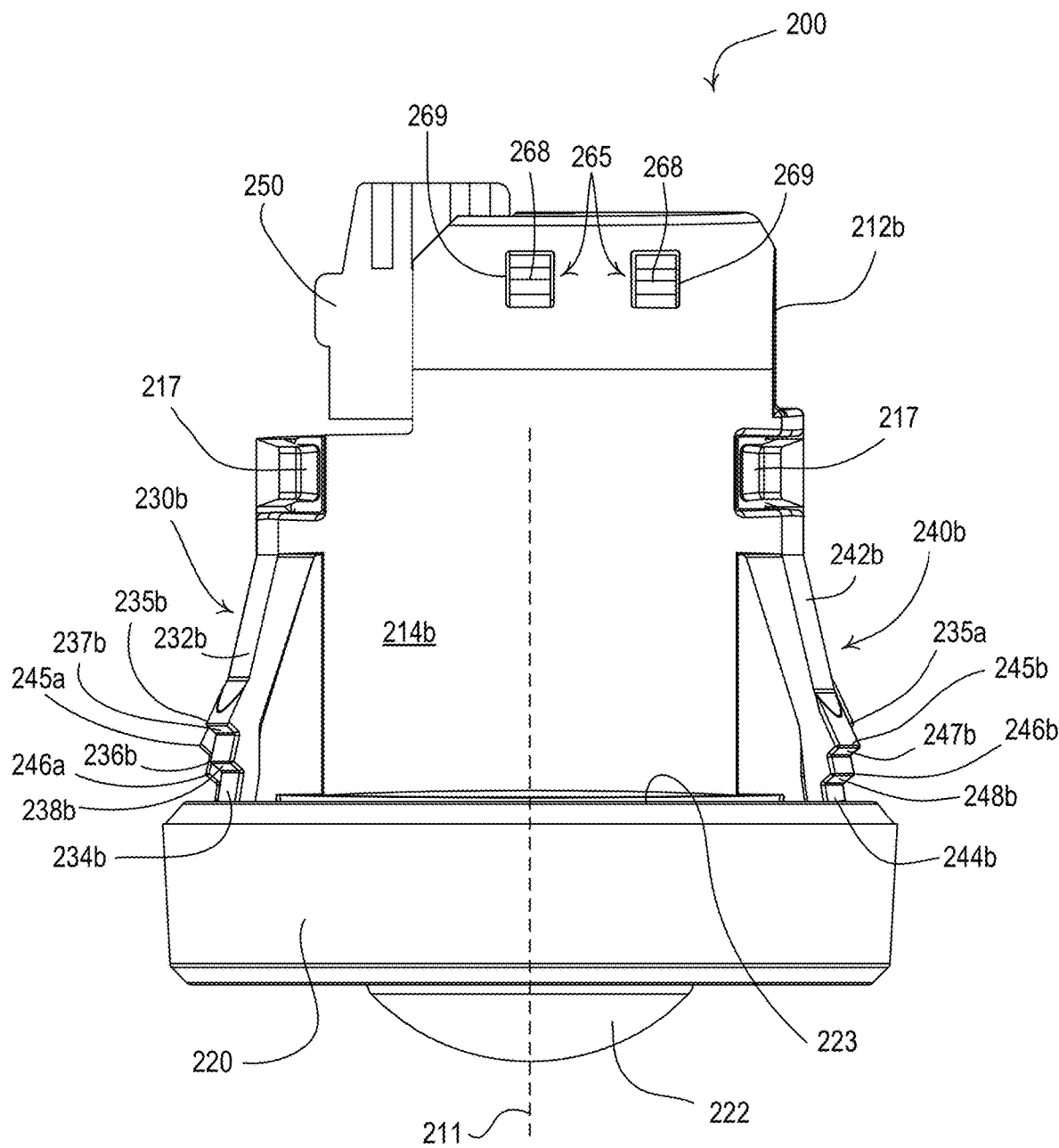
FIG. 5 is a transverse side view of the control module of FIG. 2 (e.g., looking in a transverse direction).
Figure 5:
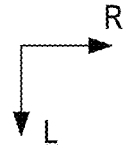
Figure 6:
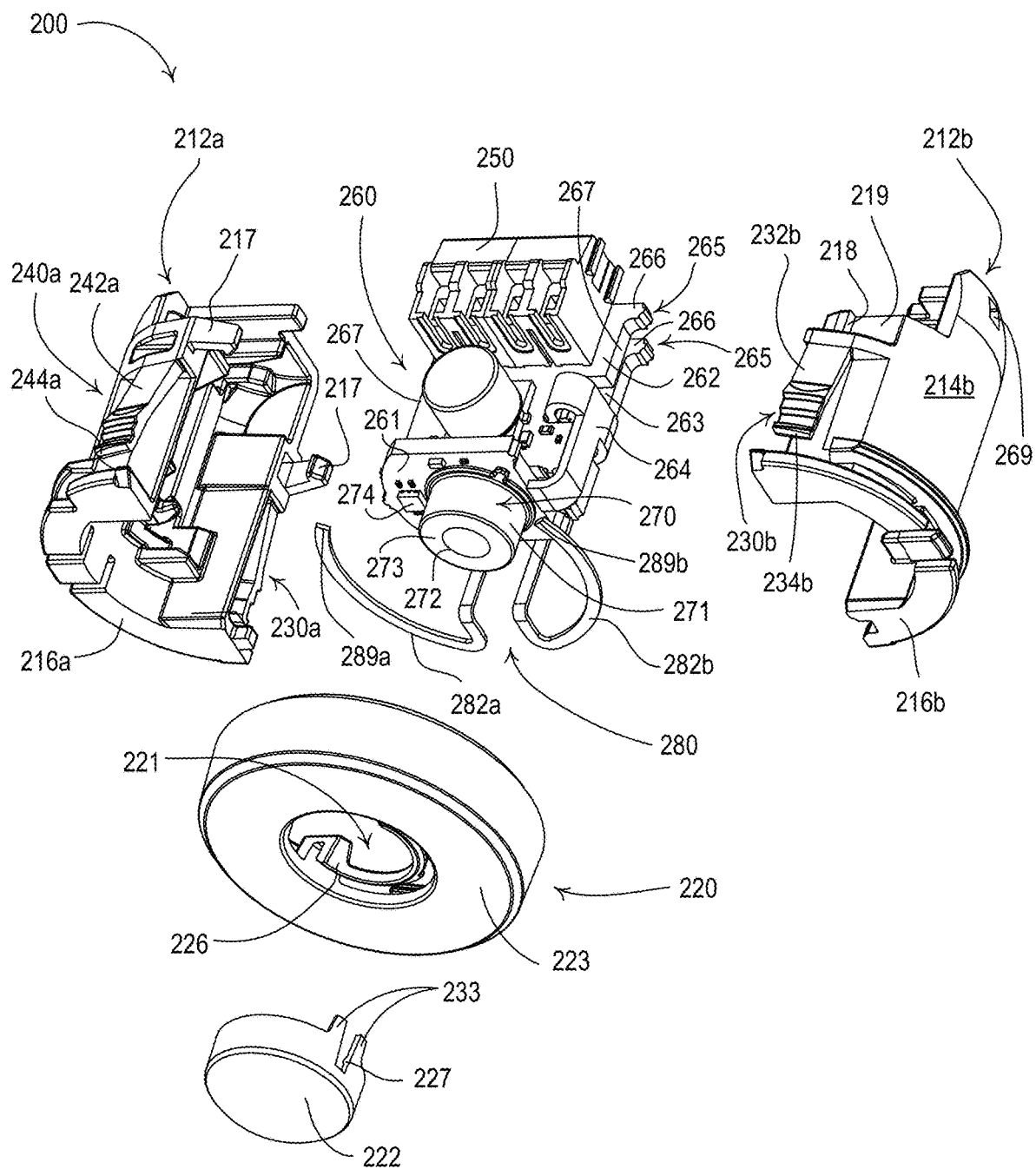
FIGS. 6 and 7 are exploded views of the control module of FIG. 2.
Figure 7:
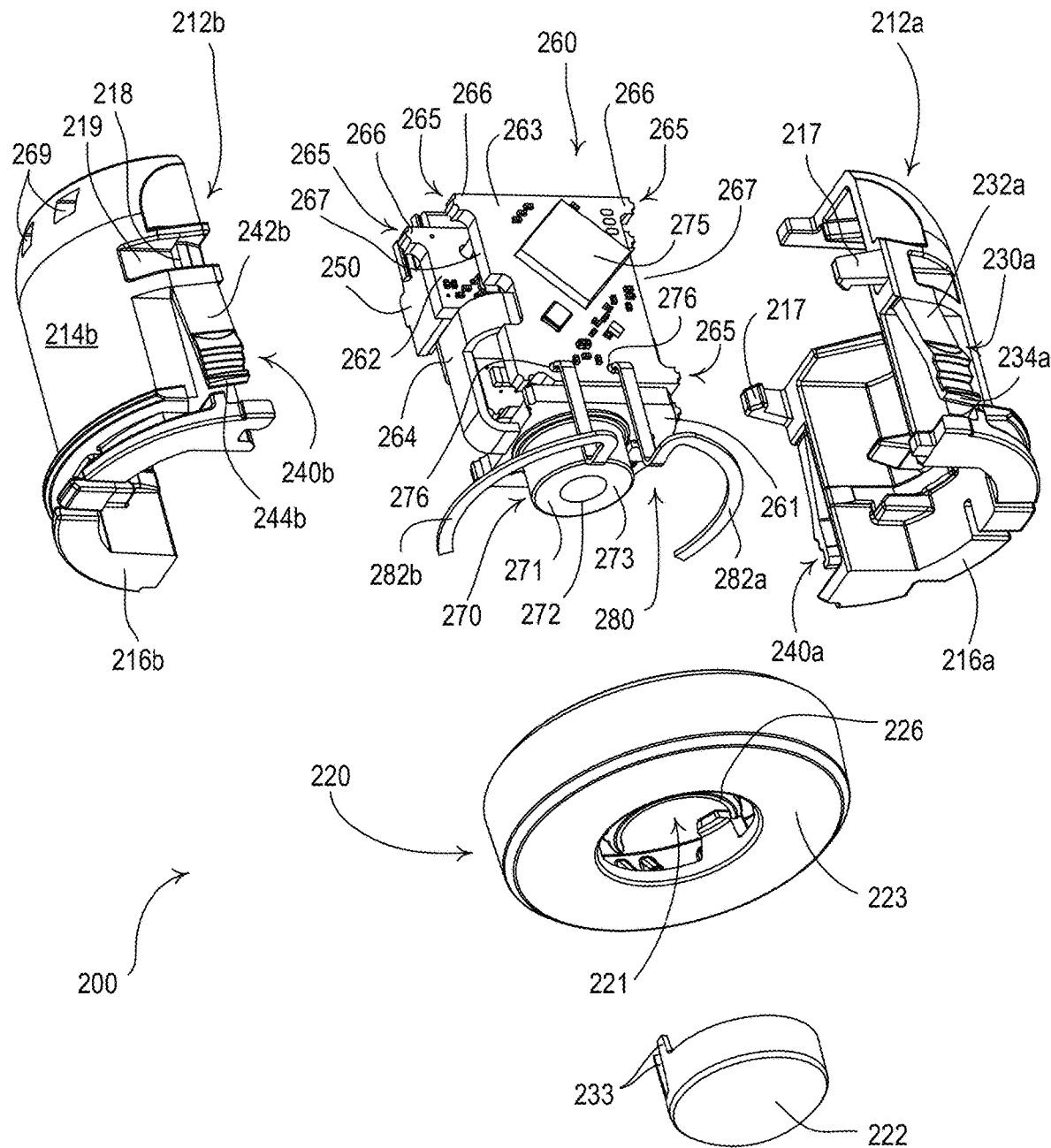
Figure 8:
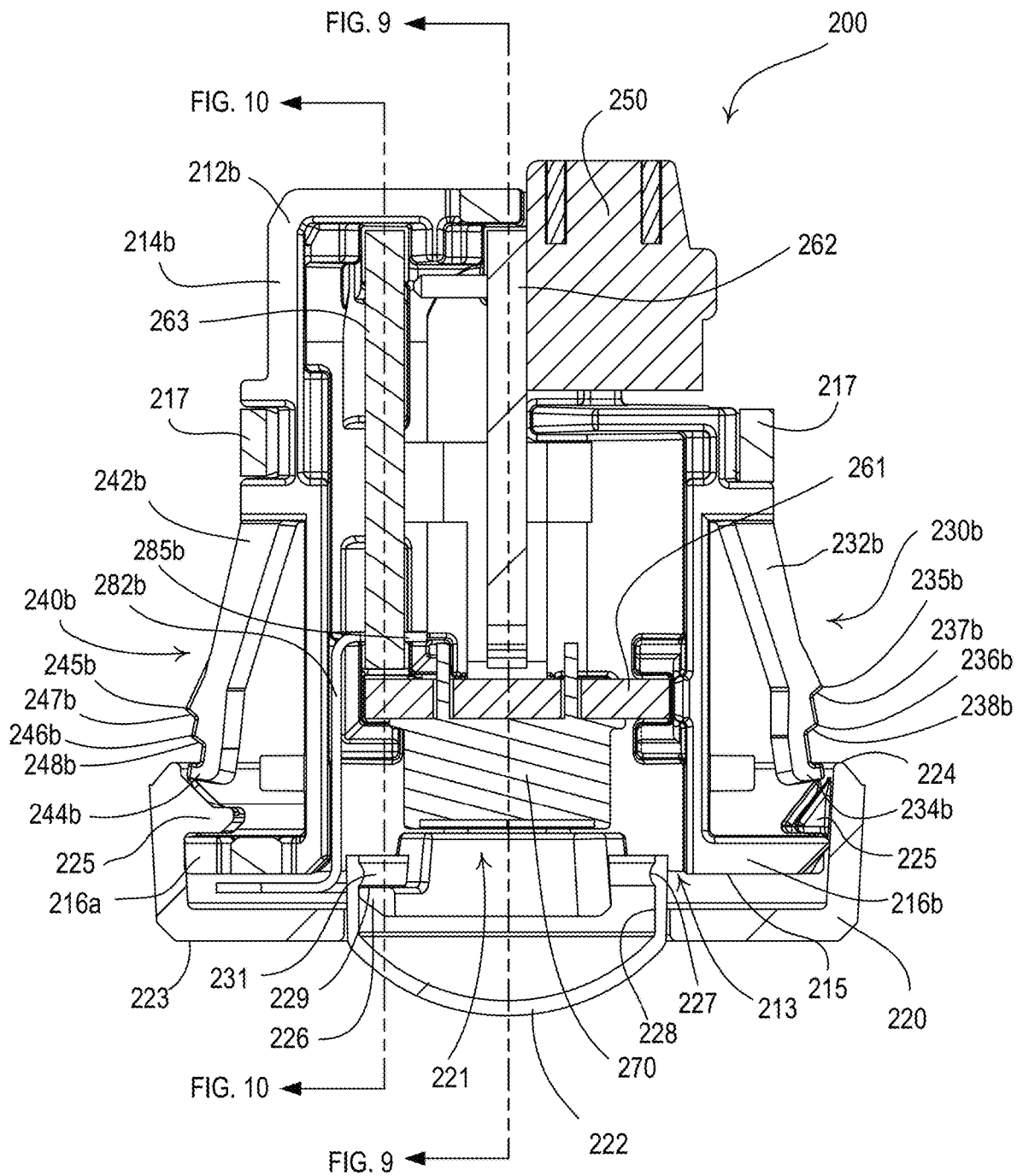
FIG. 8 is a side cross-sectional view of the control module of FIG. 2 taken through the center of the control module.

FIGS. 2 and 3 are perspective views depicting an example control module 200 (e.g., a sensor module), which may be deployed as the control modules 120a-120d for the load control system 100 shown in FIG. 1. FIG. 2 also shows a partial view an example lighting fixture 202 (e.g., a corner 203 of the lighting fixture 202) into which the control module 200 may be installed (e.g., attached and/or mounted). FIG. 4 is a radial side view of the control module 200 (e.g., looking in a radial direction R) and FIG. 5 is a transverse side view of the control module 200 (e.g., looking in a transverse direction T, i.e., 90° from the view of FIG. 4). FIGS. 6 and 7 are exploded views of the control module 200. FIG. 8 is a side cross-sectional view of the control module 200 taken through the center of the control module 200 (e.g., through the line shown in FIG. 4). The control module 200 may be configured to be attached (e.g., mounted) to the lighting fixture 202 (e.g., one of the lighting fixtures 110a-110d) and electrically connected to different types of lighting control devices, such as different types of LED drivers, for example. The control module 200 may be electrically connected to the lighting control device(s) (e.g., via a wired communication link and/or control link) to enable control of the lighting control device(s) in response to information provided from the control module 200.

The control module 200 may comprise an enclosure 210 having a first enclosure portion 212a and a second enclosure portion 212b. The enclosure 210 of the control module 200 may be configured to be received in a fixture opening 204 (e.g., a circular fixture opening) of a housing 205 of the lighting fixture 202. The fixture opening 204 may extend from an outer surface 206 (e.g., a bottom surface) to an inner surface 208 of the housing 205 of the lighting fixture 202, such that the housing 205 (e.g., the material of the housing) is characterized by a thickness T (e.g., as shown in FIG. 2). For example, the fixture opening 204 may have a diameter of approximately 0.86-0.95 inches. The first and second enclosure portions 212a, 212b of the enclosure 210 may each comprise respective side walls 214a, 214b shaped to allow the enclosure 210 to be received in the fixture opening 204. For example, the enclosure 210 may extend in a longitudinal direction L and may have a cylindrical shape that may be centered about a central axis 211 of the control module 200 (e.g., that also extends in the longitudinal direction L). For example, the longitudinal direction L may be defined by the central axis 211. The first and second enclosure portions 212a, 212b may be attached to each other, for example, to define the cylindrical shape of the enclosure 210. When the first and second enclosure portions 212a, 212b are attached to each other, the enclosure 210 may define an opening 213 in a bottom side 215 of the enclosure 210, as shown in FIG. 8. The first and second enclosure portions 212a, 212b of the enclosure 210 may comprise respective flange portions 216a, 216b that surround the bottom side 215 of the enclosure 210 at the ends of the side walls 214a, 214b (e.g., that surround the opening 213 of the enclosure 210). The flange portions 216a, 216b may extend radially from the opening 213. The first enclosure portion 212a may comprise snaps 217 configured to engage (e.g., be attached to) ledges 218 in recesses 219 in the second enclosure portion 212a to affix the first and second enclosure portions 212a, 212b together, as shown in FIGS. 6 and 7.

The control module 200 may comprise a cover portion 220 (e.g., a bezel) configured to cover the opening 213 in the enclosure 210 and/or the fixture opening 204 in the lighting fixture 202 to which the control module 200 is mounted. The control module 200 may further comprise a lens 222 received in an aperture 221 in a front surface 223 of the cover portion 220. The aperture 221 and the lens 222 may be centered about the central axis 211 of the control module 200. When the fixture opening 204 is located in a bottom surface of the lighting fixture 202, the cover portion 220 and the lens 222 may be directed downward (e.g., towards the floor). When the control module 200 is installed (e.g., fully inserted) in the fixture opening 204, a rear edge 224 (e.g., a rear surface) of the cover portion 220 may contact the outer surface 204 of the lighting fixture 204. The lens 222 may be dome-shaped and made of at least a partially infrared or visible light transparent material to allow infrared energy to enter the enclosure 210 through the aperture 221. The cover portion 220 may comprise tabs 225 (e.g., as shown in FIG. 8) configured to contact the flange portions 216a, 216b of the first and second enclosure portions 212a, 212b to attach the cover portion 220 to the enclosure 210.

The lens 222 may be configured to rest in (e.g., be received by) a support structure 226 of the cover portion 220. The cover portion 220 may comprise a rib 227 extending around an inner surface 228 of the lens 222. The rib 227 may be configured to engage complementary features in the cover portion 220. When the lens 222 is inserted into the aperture 221 in the front surface 223 of the cover portion 220, the rib 227 may be held underneath an inner edge 229 of the support structure 226 to retain the lens 222 in the aperture 221. For example, the support structure 226 may define a recess 231 that is configured to receive the rib 227 such that the lens 222 is releasably secured to the cover portion 220. The lens 222 may also comprise projections 233 that may be received around a corresponding structure (not shown) of the cover portion 220 when the lens 222 is received within the aperture 221.

The control module 200 may comprise an occupancy detection circuit having a detector 270. For example, the occupancy detection circuit may comprise a passive infrared (PIR) sensing circuit, and the detector 270 may comprise a pyroelectric detector. The detector 270 may be configured to detect infrared energy from an occupant in a load control environment (e.g., such as the room 102 shown in FIG. 1) that may enter the control module 200 through the aperture 221 of the cover portion 220 (e.g., through the lens 222). The control module 200 may be configured to detect motion in the load control environment (e.g., occupancy and/or vacancy conditions) in response to the infrared energy detected by the detector 270. When the fixture opening 204 is located in a bottom surface of the lighting fixture 202, the control module 200 may be configured to detect occupancy and/or vacancy conditions in the space (e.g., the load control environment) beneath the lighting fixture 202 to which the control module 200 is attached.

The first and second enclosure portions 212a, 212b may each comprise one or more clips (e.g., first clips 230a, 230b and/or second clips 240a, 240b) for mounting the control module 200 to the lighting fixture 202 (e.g., within the fixture opening 204). For example, the first enclosure portion 212a may comprise a first clip 230a and a second clip 240a. The first and second clips 230a, 240a of the first enclosure portion 212a may each comprise a respective arm 232a, 242a. The first and second clip 230a, 240a of the first enclosure portion 212a may each comprise a plurality of teeth located at an end 234a, 244a of the respective arm 232a, 242a. For example, the first clip 230a of the first enclosure portion 212a may comprise a first tooth 235a and a second tooth 236a. The first tooth 235a may define an engagement surface 237a and the second tooth 236a may define an engagement surface 238a. The second clip 240a of the first enclosure portion 212a may comprise a first tooth 245a and a second tooth 246a. The first tooth 245a may define an engagement surface 247a and the second tooth 246a may define an engagement surface 248a. The first teeth 235a, 245a and the second teeth 236a, 246a of the first and second clips 230a, 240a of the first enclosure portion 212a may be located at different locations along the length of each of the first and second clips 230a, 240a (e.g., the first and second clips 230a, 240a are not identical). For example, the first tooth 235a and the second tooth 236a of the first clip 230a may be displaced along the first clip 230a in a first layout, and the first tooth 245a and the second tooth 246a of the second clip 240a may be displaced along the second clip 240a in a second layout. While each clip 230a, 240a may comprise two teeth as shown in FIGS. 2-12, each of the clips may comprise more or less teeth, and the first and second clips 230a, 240a may comprise different numbers of teeth.

The second enclosure portion 212b may comprise a first clip 230b and a second clip 240b. The first and second clips 230b, 240b of the second enclosure portion 212b may each comprise a respective arm 232b, 242b. The first and second clip 230b, 240b of the second enclosure portion 212b may each comprise a plurality of teeth located at an end 234b, 244b of the respective arm 232b, 242b. For example, the first clip 230b of the second enclosure portion 212b may comprise a first tooth 235b and a second tooth 236b. The first tooth 235b may define an engagement surface 237b and the second tooth 236b may define an engagement surface 238b. The second clip 240b of the second enclosure portion 212b may comprise a first tooth 245b and a second tooth 246b. The first tooth 245b may define an engagement surface 247b and the second tooth 246b may define an engagement surface 248b. The first teeth 235b, 245b and the second teeth 236b, 246b of the first and second clips 230b, 240b of the second enclosure portion 212b may be located at different locations relative to each other along the length of each clip 230b, 240b (e.g., the first and second clips 230b, 240b are not identical). For example, the first tooth 235b the second tooth 236b of the first clip 230b may be displaced along the first clip 230b in the first layout, and the first tooth 245b the second tooth 246b of the second clip 240b may be displaced along the second clip 240b in the second layout. The first clip 230a of the first enclosure portion 212a and the first clip 230b of the second enclosure portion 212b may be identical (e.g., having the first layout of teeth), and the second clip 240a of the first enclosure portion 212a and the second clip 240b of the second enclosure portion 212b may be identical (e.g., having the second layout of teeth). While the control module 200 is described herein with the first and second enclosure portions 212a, 212b each having one of the first clips 230a, 230b and one of the second clips 240a, 240b, one of the first and second enclosure portions 212a, 212b could have two of the first clips (e.g., both having the first layout of teeth) and the other of the first and second enclosure portions 212a, 212b could have two of the second clips (e.g., both having the second layout of teeth).

The first and second clips 230a, 240a of the first enclosure portion 212a and the first and second clips 230b, 240b of the second enclosure portion 212b may be received by the fixture opening 204 for mounting the control module 200 to the lighting fixture 202. One or more of the teeth 235a, 236a, 245a, 246a of the first enclosure portion 212a and one or more of the teeth 235b, 236b, 245b, 246b of the second enclosure portion 212b may be configured to engage the fixture opening 204 for mounting (e.g., locking) the control module 200 within the fixture opening 204 of the lighting fixture 202. One or more of the teeth 235a, 235b, 236a, 236b, 245a, 245b, 246a, 246b may secure the control module 200 within the fixture opening 204, such that the rear edge 224 of the cover portion 220 contacts the bottom surface 204 of the lighting fixture 202. The clips 230a, 230b, 240a, 240b may be resiliently biasable, for example, towards the central axis 211. As the control module 210 is inserted into the fixture opening 204 (e.g., along an insertion direction 209 shown in FIG. 2), the arms 232a, 232b, 242a, 242b of the respective clips 230a, 230b, 240a, 240b may be configured to bend in towards the sidewalls 214a, 214b of the first and second enclosure portions 212a, 212b such that the teeth 235a, 235b, 236a, 236b, 245a, 245b, 246a, 246b are biased toward the sidewalls 214a, 214b. The surface surrounding the fixture opening 204 may press the clips 230a, 230b, 240a, 240b toward the sidewalls 214a, 214b such that the clips 230a, 230b, 240a, 240b fit within the fixture opening 204, as the control module 200 is inserted into the fixture opening 204. The control module 200 may be secured in position within the fixture opening 204 when one or more of the engagement surfaces 237a, 237b, 238a, 238b, 247a, 247b, 248a, 248b contacts the inner surface 208 of the material of the housing 205 of the lighting fixture 202. For example, one or more of the engagement surfaces 237a, 237b, 238a, 238b, 247a, 247b, 248a, 248b may be configured to prevent the control module 200 from falling out of the fixture opening 204.

When the first and second enclosure portions 212a, 212b are attached to each other, the first and second clips 230a, 230b, 240a, 240b may be arranged in pairs (e.g., adjacent pairs). Each pair of clips may have one clip having the first layout of teeth (e.g., one of the first clips 230a, 230b) and one clip having the second layout of teeth (e.g., one of the second clips 240a, 240b). For example, the first clip 230a of the first enclosure portion 212a and the second clip 240b of the second enclosure portion 212b may be located adjacent to each other, e.g., as a first pair. Since the first and second clips 230a, 240b have different layouts of teeth (e.g., the first and second layouts, respectively), the teeth 235a, 236a of the first clip 230a of the first enclosure portion 212a and the teeth 245b, 246b of the second clip 240b of the second enclosure portion 212b may be located at different locations relative to each other along the length of each clip 230a, 240b. For example, the teeth 235a, 236a of the first clip 230a may be staggered as compared to the teeth 245b, 246b of the second clip 240b (e.g., the teeth of the first and second clips 230a, 240b may be staggered relative to each other). For example, either one of the teeth 235a, 236a of the first clip 230a or one of the teeth 245b, 246b of the second clip 240b (e.g., one tooth of the pair of clips 230a, 240b) may engage the fixture opening 204 (e.g., the surface defining the fixture opening 204) at a single time.

Similarly, the first clip 230b of the second enclosure portion 212b and the second clip 240a of the first enclosure portion 212a may be located adjacent to each other, e.g., as a second pair (e.g., as shown in FIG. 4). Since the first and second clips 230b, 240a have different layouts of teeth (e.g., the first and second layouts, respectively), the teeth 235b, 236b of the first clip 230b of the second enclosure portion 212b and the teeth 245a, 246a of the second clip 240a of the first enclosure portion 212a may be located at different locations relative to each other along the length of each clip 230b, 240a. For example, the teeth 235b, 236b of the first clip 230b may be staggered as compared to the teeth 245a, 246a of the second clip 240a (e.g., the teeth of the first and second clips 230b, 240a may be staggered relative to each other). For example, either one of the teeth 235b, 236b of the first clip 230b or one of the teeth 245a, 246a of the second clip 240a (e.g., one tooth of the pair of 230b, 240a) may engage the fixture opening 204 (e.g., the surface defining the fixture opening 204) at a single time. Even though both pairs of clips are located at the junction of the first and second enclosure portions 212a, 212b as shown in FIGS. 2-8, the pairs of clips may be located at other locations on each of the first and second enclosure portions 212, 212b, for example, near the center of each of the respective first and second enclosure portions 212, 212b (e.g., shifted 90 degrees from the positions shown in FIGS. 2-8). In addition, while the first and second clips 230a, 230b, 240a, 240b are located immediately adjacent to each other when the first enclosure portion 212a is connected to the second enclosure portion 212b, the first and second clips of each pair of clips may also be distanced apart, for example, with up to approximately one-fourth of the circumference of the enclosure 210 between the first and second clips of each pair (e.g., the first and second clips may be spaced apart by approximately 90 degrees).

The teeth 235a, 235b, 236a, 236b, 245a, 245b, 246a, 246b may be configured to allow the control module 210 to be mounted to various lighting fixtures that have housings made of materials of differing thicknesses. The staggering of the teeth between adjacent clips as described above may allow the control module 200 to be installed in the fixture opening 204 at one of a number of different positions, such as four different positions P1, P2, P3, P4 (e.g., insertion depths) as shown in FIG. 4. The four different positions P1-P4 may represent the different thicknesses of the materials of the housings of the various lighting fixtures to which the control module 200 may be mounted. In some examples, a first clip of a pair of clips (e.g., the first clip 230b shown in FIG. 4) may comprise a first number X of teeth and a second clip of the pair of clips (e.g., the second clip 240a shown in FIG. 4) may comprise a second number Y of teeth, such that the control module 200 may be configured to be installed in the fixture opening 204 at a third number Z of distinct positions (e.g., depths of insertion), where the third number Z may be equal to the first number X plus the second number Y (e.g., Z=X+Y).

As shown by the adjacent first and second clips 230b, 240a (e.g., the second pair of clips) shown in FIG. 4, alternating teeth on the first and second clips 230b, 240a (e.g., and on the first and second clips 230a, 240b) may engage the fixture opening 204 (e.g., a structure surrounding the fixture opening 204) as the control module 200 is inserted into the fixture opening 204 (e.g., along the insertion direction 209 shown in FIG. 2). While the control module 200 is being inserted into the fixture opening 204, the tooth 235b of the first clip 230b may contact the structure surrounding the fixture opening 204 first (e.g., before the other teeth) causing the first clip to flex towards the center (e.g., the central axis 211) of the control module 210 until the fixture opening 204 moves past a peak of the tooth 235b. The peak of each of the teeth may define a distal edge of the respective engagement surface. This allows the first clip 230b to spring back away from the central axis 211 and the engagement surface 237b of the tooth 235b to contact the lighting fixture 202. As the control module 200 is inserted further into the fixture opening 204, the tooth 245a of the second clip 240a may contact the lighting fixture 202 causing the second clip to be flex towards the center (e.g., the central axis 211) of the control module 210 until the fixture opening 204 moves past a peak of the tooth, which allows the second clip to spring back away from the central axis 211 and the engagement surface 247a of the tooth 245a to contact the structure surrounding the fixture opening 204. As the control module 200 is inserted further into the fixture opening 204, the tooth 236b of the first clip 230b may contact the lighting fixture 202, and then the tooth 246a of the second clip 240a may contact the structure surrounding the fixture opening 204. Stated differently, the teeth 235b, 245a, 236b, 246a, may be staggered between the first clip 230b and the second clip 240a, such that the teeth contact and engage the structure surrounding the fixture opening 204 in the following order: the tooth 235b of the first clip 230b, the tooth 245a of the second clip 240a, the tooth 236b of the first clip 230b, and the tooth 246a of the second clip 240a, which allows the control modules to pass through, in order, the position P1 through position P4. In some examples, as the control module 200 is inserted into the fixture opening 204, a first tooth (e.g., the tooth 235b of the flip clip 230b) may be configured to engage the fixture opening 204 (e.g., first in order), a second tooth (e.g., the tooth 245a of the second clip 240a) may be configured to engage the fixture opening 204 after the first tooth (e.g., second in order), a third tooth (e.g., the tooth 236b of the first clip 230b) may be configured to engage the fixture opening 204 third after the second tooth (e.g., third in order), and a fourth tooth (e.g., the tooth 246a of the second clip 240a) may be configured to engage the structure surrounding fixture opening 204 after the third tooth (e.g., fourth in order).

While the above description of the insertion of the control module 200 into the fixture opening 204 primarily refers to the first clip 230b and the second clip 240a (e.g., the second pair of clips), a similar sequence of events occurs for the first clip 230a and the second clip 240b (e.g., the first pair of clips) as the control module 200 is inserted into the fixture opening 204. In addition, while the above description of the insertion of the control module 200 into the fixture opening 204 describes the control module being inserted into the fixture until the tooth 246a of the second clip 240a may contact the structure surrounding the fixture opening 204 (e.g., the sensor is in position P4), the insertion of the control module 200 into the fixture opening 204 may stop prior to position P4, e.g., when the rear edge 224 of the cover portion 220 contacts the outer surface 206 of the housing 205 of the lighting fixture 202 (e.g., in one of the positions P1-P3).

The positioning of the teeth 235a, 235b, 236a, 236b, 245a, 245b, 246a, 246b to stagger the teeth between the first and second clips 230a, 230b, 240a, 240b may allow for there to be less teeth per clip (e.g., two teeth per clip) while providing more positions (e.g., four positions) for mounting of the control module 200. Having less teeth per clip may enable the engagement surfaces 237a, 237b, 238a, 238b, 247a, 247b, 248a, 248b to be larger so that the control module 200 can more easily be maintained in the positions P1-P4 (e.g., the area of contact between the engagement surface and the lighting fixture 202 is increased as compared to smaller teeth). For example, the first and second clips 230a, 230b, 240a, 240b may be designed such that the control module 200 may be easily installed in the fixture opening 204 of the lighting fixture 202, while being difficult to be removed from the fixture opening 204. In addition, having the teeth at a wider pitch (e.g., farther away from each other) allows for easier manufacturing (e.g., molding) of the clips (e.g., fine teeth may be more difficult to mold). Providing more positions at which the control module 200 may be mounted to the lighting fixture 202 may allow for a more flexible installation that may account for warping of the housing 205 of the lighting fixture 202 and ensure that the rear edge 224 of the cover portion 220 is flush with the outer surface 206 (e.g., the bottom surface) of the lighting fixture 202 (e.g., which may prevent light from shining through a potential gap between the cover portion 220 and the housing 205 of the lighting fixture 202).

The control module 200 may comprise a connector 250 that may allow for connection to an external power source (e.g., such as an external direct-current (DC) power source) and/or an external load control device for controlling a lighting load located in the lighting fixture 202 (e.g., such as an LED driver for controlling an LED light source). For example, the connector 250 may comprise two electrical terminals 252 configured to receive wires that may be connected to the power source to allow the control module 200 to receive power for powering the electrical circuitry of the control module 200. In addition, the connector 250 may comprise two electrical terminals 254 that may receive wires that may be connected to the load control device via a wired communication link and/or a wired control link for controlling the lighting load.

As shown in FIGS. 6 and 7, the control module 200 may comprise a printed circuit board (PCB) assembly 260, which may be housed by the enclosure 210 and the cover portion 220. The printed circuit board assembly 260 may comprise a combination of rigid and flexible printed circuit boards (e.g., a rigid-flex printed circuit board). For example, the printed circuit board assembly 260 may comprise a first printed circuit board 261 (e.g., a sensor printed circuit board), a second printed circuit board 262 (e.g., a power printed circuit board), and a third printed circuit board 263 (e.g., a control printed circuit board). The first, second, and third printed circuit boards 261, 262, 263 may be electrically connected together via a flexible connector 264 (e.g., a flexible printed circuit board). For example, the first, second, and third printed circuit boards 261, 262, 263 may comprise multiple layer printed circuit boards (e.g., having three or more layers), where the outer layers are made of a rigid substrate (e.g., FR4) and one of more of the inner layers are made of a flexible printed circuit board material. The flexible connector 264 may be formed as part of one or more of the flexible inner layers of the first, second, and third printed circuit boards 261, 262, 263.

Figure 13:
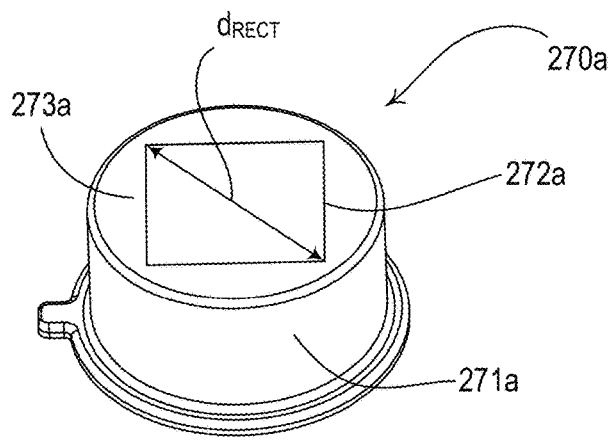
FIG. 13 is a perspective view of a detector that may be used in the control module of FIG. 2.

The detector 270 may be mounted to the first printed circuit board 261, and the first printed circuit board 261 may be oriented such that the detector 270 is directed towards the lens 222 and the aperture 221 in the cover portion 220 (e.g., directed in the longitudinal direction L). For example, the first printed circuit board 261 may be oriented in a plane that extends in the transverse direction T and the radial direction R. The detector 270 may comprise one or more pyroelectric elements (not shown) that are responsive to the infrared energy received by the detector 270. The detector 270 may comprise a housing 271 (e.g., a cylindrical housing) that encloses the pyroelectric elements. The housing 271 may have an opening 272 through which the pyroelectric elements may receive the infrared energy. The opening 272 may be located in a front surface 273 of the housing 271 (e.g., which may be oriented in a plane that extends in the transverse and radial directions T, R and is perpendicular to the longitudinal direction L). The housing 271 and/or the opening 272 in the housing 271 may be centered along the central axis 211 of the control module 200. For example, the opening 272 may be circular as shown in FIGS. 6 and 7. In addition, the opening may be rectangularly-shaped, e.g., such as square-shaped (e.g., as shown in FIG. 13). The opening 272 may define an area $A_{DET}$ that is bounded by a perimeter of the opening 272 (e.g., a circular perimeter as shown in FIGS. 6 and 7). The housing 271 may be made of, for example, a conductive material, such as metal, and/or a non-conductive material, such as plastic. The first printed circuit board 261 may also have a photo-sensing circuit (e.g., a light sensing circuit), such as a photosensor 274, mounted thereto. The photosensor 274 may be configured to measure an amount of light shining through the lens 222.

The second printed circuit board 262 may extend through the enclosure 210 of the control module 200 in the longitudinal direction L and may be oriented perpendicular to the first printed circuit board 261. For example, the second printed circuit board 262 may be oriented in a plane that extends in the longitudinal direction L and the transverse direction T. The connector 250 may be mounted to the second printed circuit board 262. In addition, the second printed circuit board 262 may have a power supply and/or one or more energy storage devices (e.g., capacitors) mounted thereto for generating a DC supply voltage for powering the electrical circuitry of the control module 200.

The third printed circuit board 263 may also extend through the enclosure 210 of the control module 200 in the longitudinal direction L and may be oriented perpendicular to the first printed circuit board 261 and parallel to the second printed circuit board 262. For example, the third printed circuit board 263 may be oriented in a plane that extends in the longitudinal direction L and the transverse direction T. A control circuit of the control module 200, such as a processor 275, may be mounted to the third printed circuit board 263. The processor 275 may be configured (e.g., software or firmware configured) to detect occupancy and/or vacancy conditions in the load control environment in response to the detector 270, and may be configured to measure the amount of light shining through the lens 222 in response to the photosensor 274. The processor 275 may also comprise a wireless communication circuit, such as a radio-frequency (RF) transceiver, and an antenna 280. The wireless communication circuit may be electrically coupled to the antenna 280 and configured to transmit and receive wireless signals (e.g., RF signals) via the antenna 280 (e.g., which will be described in greater detail below). The antenna 280 may be configured to transmit and/or receive RF signals. Additionally and/or alternatively, the control module 200 may comprise a wireless communication circuit external to the processor 275 and mounted to the third printed circuit board 263, for example. The wireless communication circuit of the control module 200 may be configured to transmit the RF signals at a transmission frequency $f_{TX}$ (e.g., approximately 2.4 GHZ). In some examples, the aperture 221 in the cover portion 220, the lens 222, the detector 270, and the photosensor 274 may be omitted from the control module, and the processor 275 may only be responsive to the RF signals received via the antenna 280.

The second and third printed circuit boards 262, 263 may each comprise attachment tabs 265 (e.g., breakaway or snap tabs and/or the remains of breakaway or snap tabs). The attachment tabs 265 may be configured to attach the second and third printed circuit boards 262, 263 to respective fabrication panels (not shown). For example, the attachment tabs 265 may each provide a perforated connection (e.g., mouse bites) between the second and third printed circuit boards 262, 263 and the respective fabrication panels. Each attachment tab 265 may comprise an extended portion 266 extending from respective edges 267 of the second and third printed circuit board 262, 263 (e.g., in the transverse direction T) to a respective end portion 268 where the perforated connection to the respective fabrication panel may be provided. The second and third printed circuit boards 262, 263 may be attached to the respective fabrication panels during manufacturing of the control module 200 (e.g., during placements of the electrical components on the respective printed circuit boards and/or soldering of the electrical components to the respective printed circuit boards). After the electrical components of the control module 200 are mechanically and electrically attached (e.g., soldered) to the second and third printed circuit boards 262, 263, the second and third printed circuit boards 262, 263 may be detached from the respective fabrication panels, for example, by breaking the perforated connections of the attachment tabs 265. The extended portion 266 of each attachment tab 265 and the respective end portion 268 may provide spacing (e.g., in the transverse direction T) between the electrical components on the second and third printed circuit boards 262, 263 and the respective perforated connections between the second and third printed circuit boards 262, 263 and the respective fabrication panels, which may minimize damage to the electrical components when the second and third printed circuit boards 262, 263 are detached from the respective fabrication panels.

Figure 9:
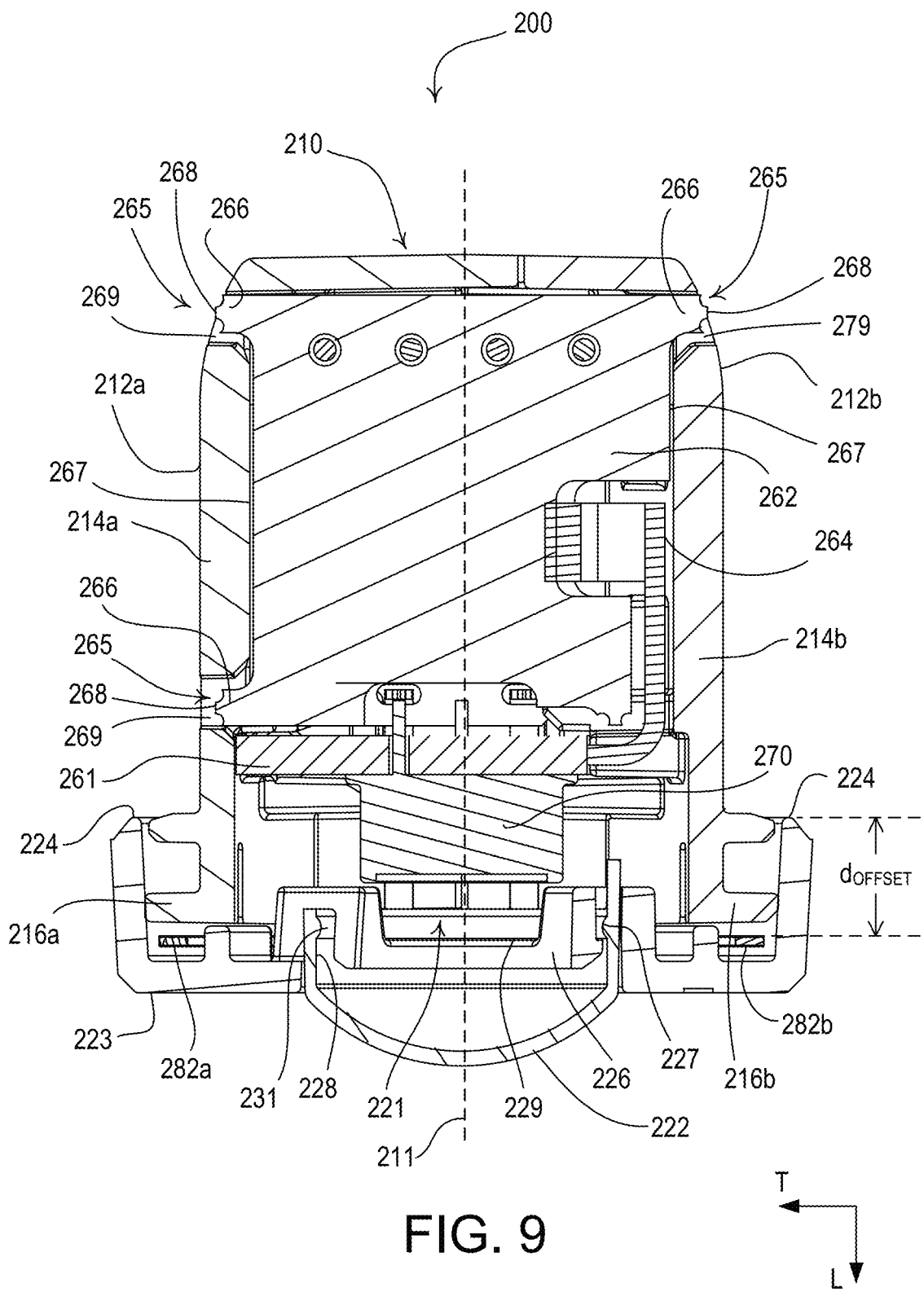
FIGS. 9 and 10 are side cross-sectional views of the control module of FIG. 2 taken through two different printed circuit boards of the control module.
Figure 10:
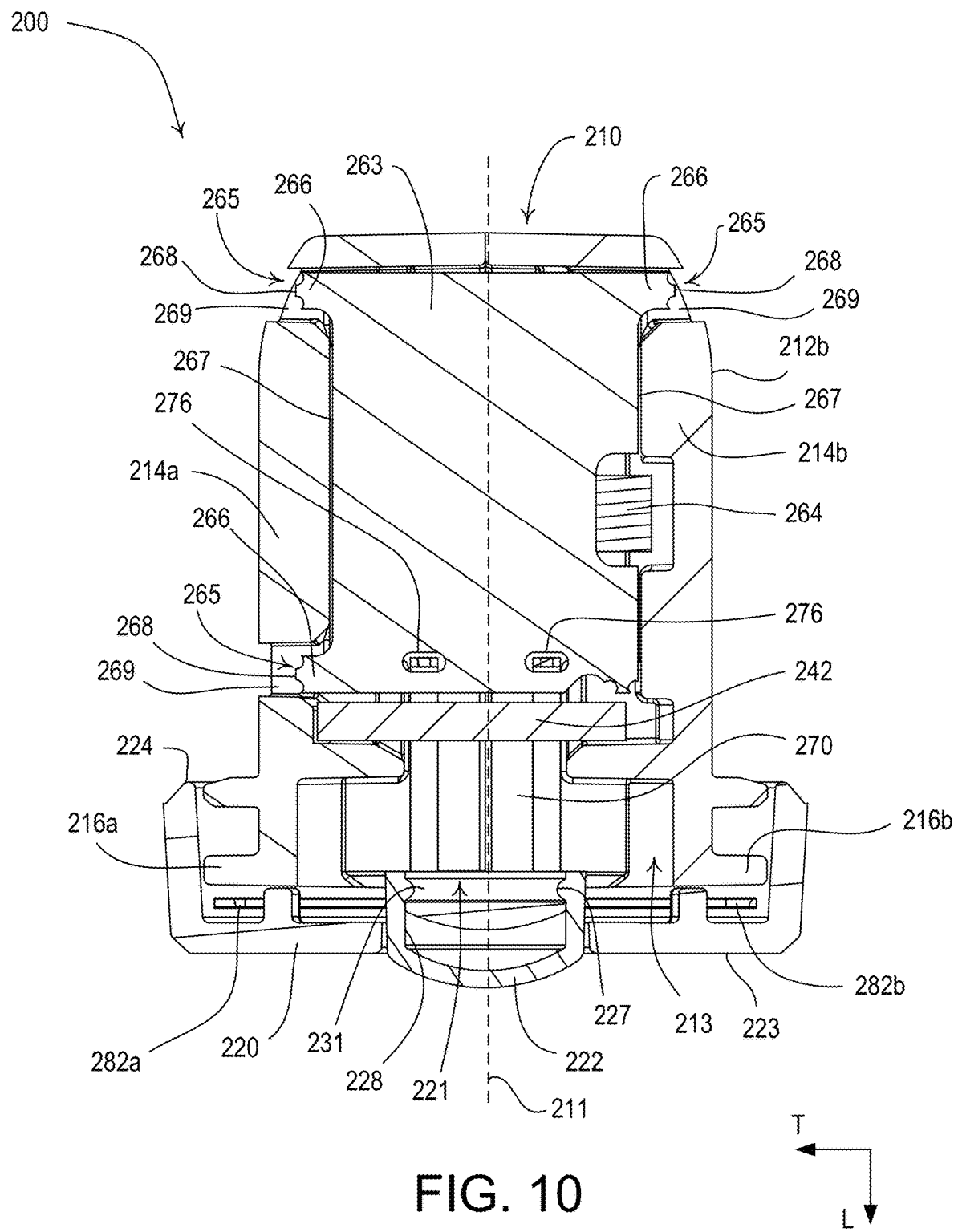

FIGS. 9 and 10 are side cross-sectional views of the control module 200 taken through the center of the second and third printed circuit boards 262, 263 respectively (e.g., through the lines shown in FIG. 8) and showing the attachment tabs 265 in greater detail. The attachment tabs 265 may be configured to be located in gaps 269 in the enclosure 210 when the control module 200 is assembled and the first and second enclosure portions 212a, 212b are attached to each other with the printed circuit board assembly 260 captured between them. With the attachment tabs 265 received in the gaps 269, the second and third printed circuit boards 262, 263 (e.g., and thus the printed circuit board assembly 260) may be aligned and positioned within the enclosure 210 (e.g., between the first and second enclosure portions 212a, 212b). For example, the gaps 269 may be configured to maintain (e.g., lock) the second and third printed circuit boards 262, 263 in the longitudinal direction L and the radial direction R. Accordingly, the attachment tabs 265 may serve the dual purpose of attaching the second and third printed circuit boards 262, 263 to the respective fabrication panels and aligning the second and third printed circuit boards 262, 263 within the enclosure 210.

Figure 11:
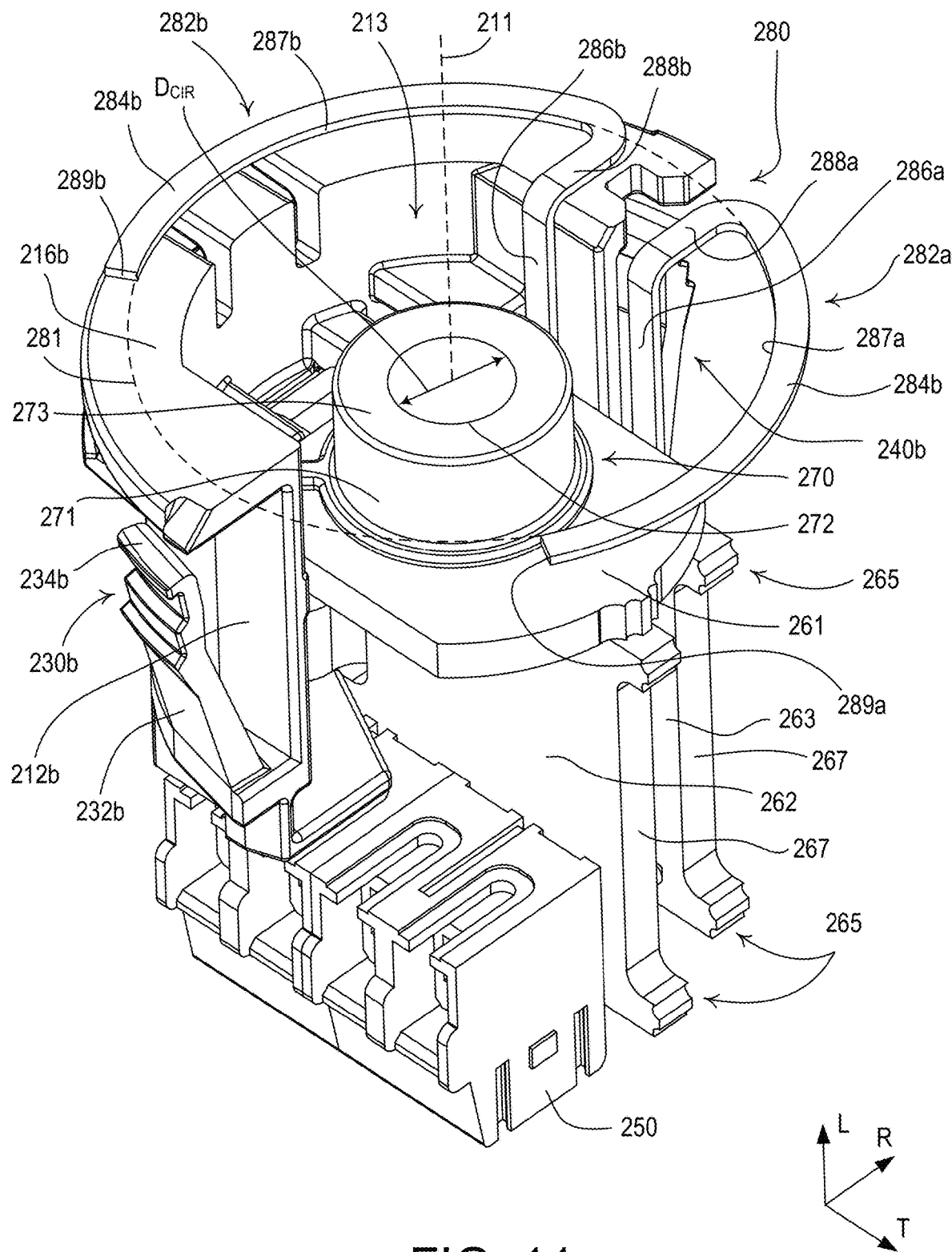
FIGS. 11 and 12 are perspective views of the control module of FIG. 2 partially assembled.
Figure 12:
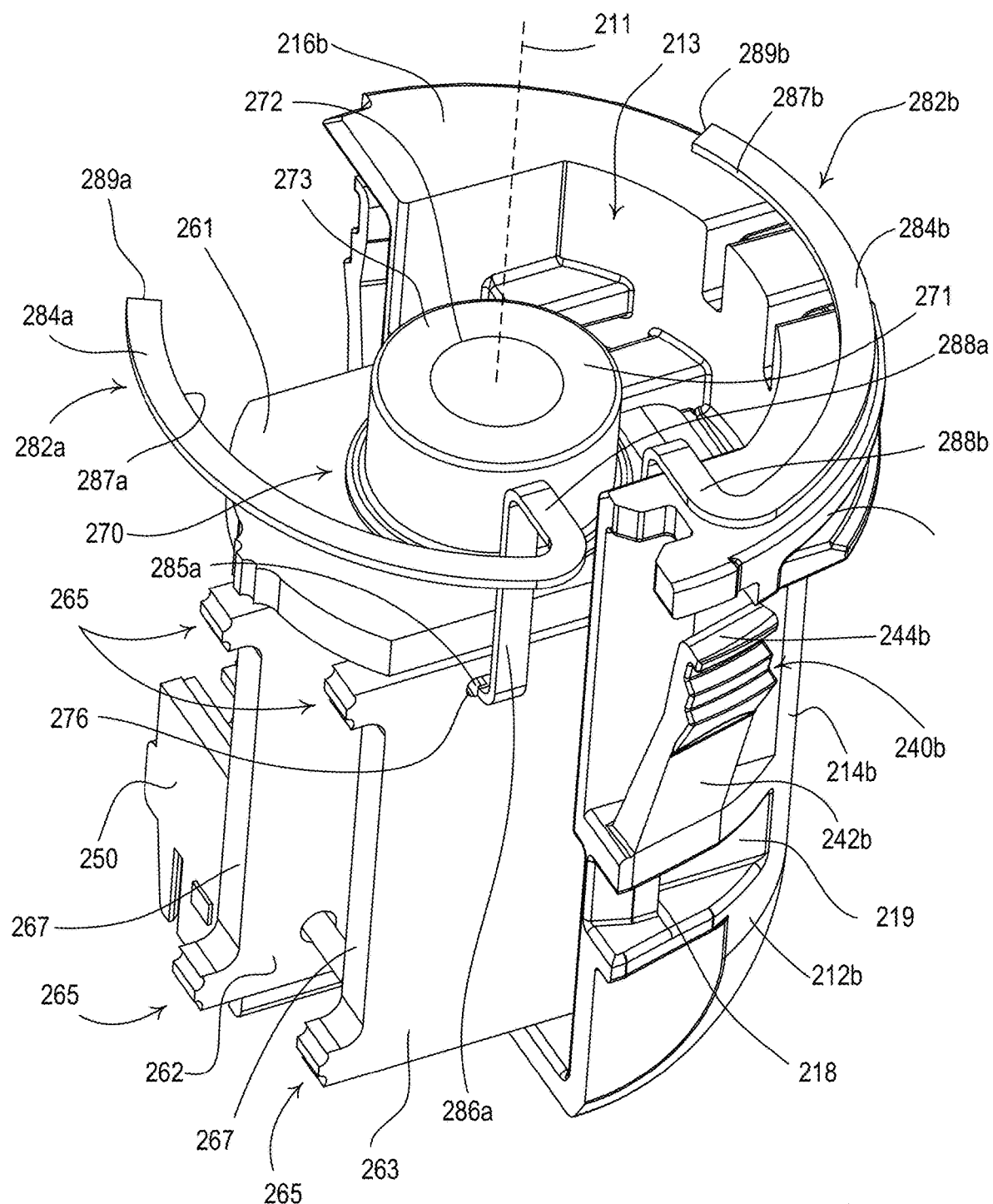

FIGS. 11 and 12 are perspective views of the control module 200 partially assembled (e.g., with the first enclosure portion 212a and the cover portion 220 removed). The antenna 280 may comprise a dipole antenna having a first antenna element 282a and a second antenna element 282b. The first and second antenna elements 282a, 282b may be electrically and mechanically coupled to the third printed circuit board 263, for example, and electrically coupled to the wireless communication circuit of the control module 200 in a dipole antenna configuration. For example, the first and second antenna elements 282a, 282b may extend through respective through-holes 276 in the third printed circuit board 263 and be soldered to electrical contacts (not shown) surrounding and/or inside of the through-holes 276. The first and second antenna elements 282a, 282b may each comprise a thin strip of a conductive material (e.g., metal). The thin strip of conductive material may be cut and bent to form the final shapes of the first and second antenna elements 282a, 282b (e.g., as shown in FIGS. 6-12). The first and second antenna elements 282a, 282b may be mirror images of (e.g., symmetric to) each other.

The first and second antenna elements 282a, 282b may each comprise a respective curved portion 284a, 284b that define ends 289a, 289b of the first and second antenna elements 282a, 282b (e.g., opposite the ends of the first and second antenna elements 282a, 282b that are received through the through-holes 276). The curved portions 284a, 284b of the first and second antenna elements 282a, 282b may be substantially planar in a plane (e.g., defined in the transverse direction T and the radial direction R) that is parallel to a plane of the front surface 223 of the cover portion 220 (e.g., parallel to a plane of the outer surface 206 of the lighting fixture 202 in which the fixture opening 204 is located). The curved portions 284a, 284b of the first and second antenna elements 282a, 282b may each define a circular-shaped segment having a center that is substantially aligned with the central axis 211 of the control module 200 (e.g., the center of the cylindrical housing of the detector 270). The curved portions 284a, 284b of the first and second antenna elements 282a, 282b may curve around the detector 270. The curved portions 284a, 284b may comprise respective inner edges 287a, 287b extend along a circular path 271 (e.g., as shown in FIG. 11) that has a center at the central axis 221 of the control module. The curved portions 284a, 284b may define an area $A_{CP}$ that is bounded by the circular path 271 of the respective inner edges 287a, 287b. For example, the area $A_{DET}$ defined by the opening 272 of the detector 270 may fall within the area $A_{CP}$ bounded by the circular path 271 of the inner edges 287a, 287b of the respective curved portions 284a, 284b (e.g., the detector 270 and/or the opening 272 of the detector 270 may be surrounded by the circular path 271 defined by the inner edges 287a, 287b of the respective curved portions 284a, 284b).

The curved portions 284a, 284b of the first and second antenna elements 282a, 282b may be located within the cover portion 220 (e.g., between the cover portion 220 and the flange portions 216a, 216b of the first and second enclosure elements 212a, 212b). Since the cover portion 220 and the flange portions 216a, 216b of the first and second enclosure elements 212a, 212b are configured to be located outside of the housing of the lighting fixture 202, the curved portions 284a, 284b of the first and second antenna elements 282a, 282b may also be located outside of the housing 205 of the lighting fixture 202. For example, because the rear edge 224 of the cover portion 220 is configured to contact the bottom surface of the lighting fixture 202, the curved portions 284a, 284b of the first and second antenna elements 282a, 282b may be located below the bottom surface of the housing 205 of the lighting fixture 202 by an offset distance $d_{OFFSET}$ (e.g., approximately 0.19 inches) as shown in FIG. 9. For example, the curve portions 284a, 284b may operate as a primary radiating structure of the antenna 280. Since the antenna 280 is arranged in a dipole antenna configuration with the curved portions 284a, 284b of the first and second antenna elements 282a, 282b located outside of the lighting fixture 202, the primary radiating structure of the antenna 280 (e.g., the curved portions 284a, 284b) may be located outside of the lighting fixture 202 where the RF signals may be more easily propagated from the control module 200. In addition, the primary radiating structure of the antenna 280 (e.g., the curved portions 284a, 284b) may be located away from noise sources inside of the lighting fixture 202 (e.g., electrical circuitry of the control module 200 and/or the lighting control device of the lighting fixture, and/or electrical wires coupled to the control module 200 and/or the lighting control device).

The first and second antenna elements 282a, 282b may comprise respective connection portions 285a, 285b (FIGS. 8 and 12) that are received in the through-holes 276. The first and second antenna elements 282a, 282b may comprise respective elongated portions 286a, 286b. After exiting the through-holes 276, the first and second antenna elements 282a, 282b may bend (e.g., bend approximately 90 degrees) at the connection portions 285a, 285b and extend along the respective elongated portions 286a, 286b towards the cover portion 220 (e.g., in the longitudinal direction L). The elongated portions 286a, 286b may be parallel to each other, such that the first and second antenna elements 282a, 282b remain equally spaced apart along the lengths of the elongated portions 286a, 286b. The elongated portions 286a, 286b may extend through the enclosure opening 213, for example, such that the respective curved portions 284a, 284b are located outside of the housing of the lighting fixture 202. After the elongated portions 286a, 286b exit through the enclosure opening 213, the first and second antenna elements 282a, 282b may bend (e.g., bend approximately 90 degrees) and extend along respective offset portions 288a, 288b away from the central axis 211 of the control module 200. The offset portions 288a, 288b may be connected to the respective curved portions 284a, 284b of the first and second antenna elements 282a, 282b, such that the curve portions 284a, 284b are located farther way from the central axis 211 than the elongated portions 286a, 286b. The elongated portions 286a, 286b may extend in the longitudinal direction L between the respective connection portions 285a, 285b and the respective offset portions 288a, 288b. The offset portions 288a, 288b may extend in the radial direction R away from the central axis 211. The curved portions 284a, 284b of the first and second antenna elements 282a, 282b may extend to the respective ends 289a, 289b. The offset portions 288a, 288b may allow the curved portions 284a, 284b (e.g., the ends 289a, 289b of the first and second antenna elements 282a, 282b) to be located away from each other (e.g., away from the central axis 211), which may increase the efficiency of the antenna 280. In addition, the offset portions 288a, 288b may allow the curved portions 284a, 284b (e.g., the ends 289a, 289b) of the first and second antenna elements 282a, 282b to be located away from the detector 270 (e.g., to prevent and/or minimize loading on the antenna 280 from the metal enclosure of the detector 270).

The detector 270 may be located at a point where the energy of the radio-frequency waves (e.g., the RF signals) generated by the antenna 280 is at a particularly high level (e.g., at a maximum level). For example, the wireless communication circuit of the control module 200 and the antenna 280 may be characterized by a transmit power greater than approximately 10 dBm (e.g., approximately 19.5 dBm). As previously mentioned, the housing 271 of the detector 270 may be made of a conductive material, such as metal. The housing 271 may be connected to circuit common (e.g., ground) of the control module 200, such that the housing 271 may operate as an RF shield for the pyroelectrical elements of the detector 270.

The opening 272 of the housing 271 of the detector 270 may be sized to shield the pyroelectrical elements of the detector 270 from the RF signals generated by the wireless communication circuit of the control module 200 and the antenna 280, e.g., which could cause unintended detections of occupancy and/or vacancy conditions. For example, the opening 272 may be circularly shaped as shown in FIGS. 11 and 12. The opening 272 may have a diameter $D_{CIR}$ that defines a cutoff frequency $f_C$ above which RF signals may propagate through the opening 272 without attenuation, and below which RF signals may be attenuated when traveling through the opening 272. For example, the cutoff frequency $f_C$ of the opening 272 (e.g., a circular opening) may be determined as a function of the diameter $D_{CIR}$ of the opening 272 and a cutoff wavelength $\lambda_C$, e.g., $\lambda_C = 1.706 \cdot D_{CIR}$, and $f_C = c/\lambda_C$, where c is the speed of light (e.g., approximately 299,792,458 m/sec). The diameter $D_{CIR}$ of the opening 272 may be sized to set the cutoff frequency $f_C$ to be larger than the transmission frequency $f_{TX}$ (e.g., $D_{CIR} = 0.586 \cdot c/f_C$). For example, when the transmission frequency $f_{TX}$ is approximately 2.4 GHZ, the diameter $D_{CIR}$ of the opening 272 may be approximately 4 millimeters, which may be approximately 1/30 of the transmission wavelength $\lambda_{TX}$ at the transmission frequency $f_{TX}$ and may result in a value of the cutoff frequency $f_C$ of approximately 44 GHz. For example, the diameter $D_{CIR}$ of the opening 272 may be between approximately 1/20 and 1/50 of the transmission wavelength $\Delta_{TX}$ at the transmission frequency $f_{TX}$.

FIG. 13 is a perspective view of another detector 270a that may be used in a control module (e.g., the control module 200). For example, the detector 270a may have a housing 271a (e.g., a cylindrical housing) having an opening 272a through which the infrared energy may be received by one or more pyroelectric elements of the detector 270a. The opening 272a may be located in a front surface 273a of the housing 271a. The housing 271a and/or the opening 272a in the housing 271a may be centrally located along a central axis of the control module (e.g., such as the housing 271 and the opening 272 of the housing 271 are centered along the central axis 211 of the control module 200). The housing 271a may be made of, for example, a conductive material, such as metal. The housing 271a may be connected to circuit common (e.g., ground) of the control module, such that the housing 271a may operate as an RF shield for the pyroelectrical elements of the detector 270a.

The opening 272a of the housing 271a may be rectangularly-shaped, e.g., such as square-shaped as shown in FIG. 13. The opening 272a of the housing 271a may be sized to shield the pyroelectrical elements of the detector 270a from the RF signals generated by a wireless communication circuit and an antenna (e.g., the antenna 280) of the control module. The opening 272a may characterized by a distance $d_{RECT}$, which may be the longest dimension of the rectangle and/or square of the opening 272a (e.g., the diagonal dimension from one corner to the opposite corner). For example, when the opening 272a is a square as shown in FIG. 13, the distance $d_{RECT}$ may be the length between one corner to the opposing corner of the square. The distance $d_{RECT}$ of the opening 272a may define a cutoff frequency $f_C$ above which RF signals may propagate through the opening 272a without attenuation, and below which RF signals may be attenuated when traveling through the opening 272a. For example, the cutoff frequency $f_C$ of the opening 272a (e.g., a rectangular opening) may be determined as a function of the distance $d_{RECT}$ and a cutoff wavelength $\lambda_C$, e.g., $\lambda_C = d_{RECT}$, and $f_C = c/\lambda_C$, where c is the speed of light (e.g., approximately 299,792,458 m/sec). The distance $d_{RECT}$ of the opening 272a may be sized to set the cutoff frequency $f_C$ to be larger than the transmission frequency $f_{TX}$ (e.g., $d_{RECT} = 0.5 \cdot c/f_C$). For example, the distance $d_{RECT}$ of the opening 272a may sized to be between approximately 1/20 and 1/50 of the transmission wavelength $\lambda_{TX}$ at the transmission frequency $f_{TX}$.

Figure 14:
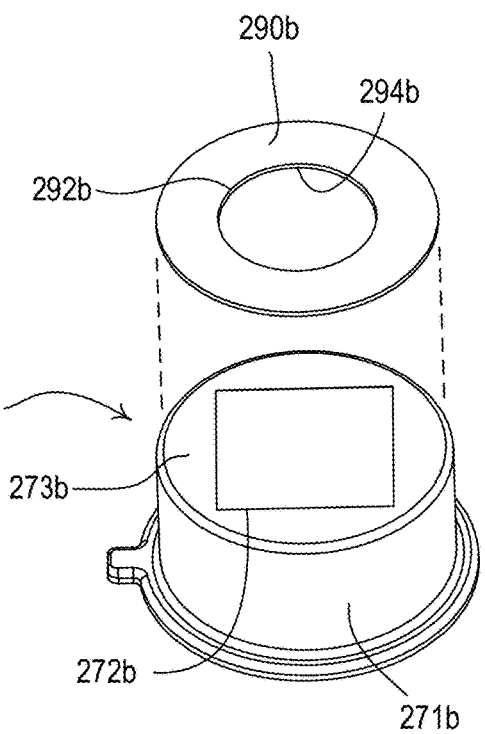
FIGS. 14 and 15 are perspective view of a detector with a shield that may be used in the control module of FIG. 2.

FIG. 14 is a perspective view of another detector 270b that may be used in a control module (e.g., the control module 200) illustrating how a shield 290b may used to reshape and/or resize an opening 272b through which the infrared energy is received by the detector 270b. For example, the detector 270b may have a housing 271b (e.g., a cylindrical housing) having a front surface 273b in which the opening 272b is located. The housing 271b and/or the opening 272b in the housing 271b may be centrally located along a central axis of the control module (e.g., such as the housing 271 and the opening 272 of the housing 271 are centered along the central axis 211 of the control module 200). The housing 271b may be made of, for example, a conductive material, such as metal. The housing 271b may be connected to circuit common (e.g., ground) of the control module, such that the housing 271b may operate as an RF shield for the pyroelectrical elements of the detector 270b. While the opening 272b is shown as being rectangularly shaped in FIG. 14, the opening 272b may also be circularly shaped (e.g., as with the opening 272 of the detector 270 shown in FIG. 12). The opening 272b of the housing 271b of the detector 270 may define an area $A_{DET}$.

The shield 290b may comprise an opening 292b that extends through the shield 290b. The shield 290b may be made of a conductive material. For example, the shield 290b may be a conductive sticker that is adhered to the front surface 273b of the housing 271b of the detector 270b. The shield 290b may comprise a conductive adhesive on a bottom surface 294b of the shield for adhering the shield 290b to the front surface 273b of the housing 271b and for electrically coupling the shield 290b to the housing 271b of the detector 270b. In addition, the shield 290b may be mechanically and/or electrically coupled to the housing 271b of the detector 270b via other means, such as, for example, a clip or other attachment member. Since the housing 271b of the detector 270b is electrically coupled to circuit common of the control module, the shield 290b may also be electrically coupled to circuit common.

The opening 292b of the shield 290b may be sized to shield the pyroelectrical elements of the detector 270b from the RF signals generated by the control module. If the opening 272b of the housing 271b of the detector 270b is not able to block the RF signals at the transmission frequency $f_{TX}$ of the control module (e.g., the length of the largest dimension of the opening 270b may result in a cutoff frequency $f_C$ is below the transmission frequency $f_{TX}$), the shield 290b may be installed on the front surface 273b of the housing 271b with the opening 292b of the shield 290b overlayed overtop of the opening 272b of the housing 271b to thus appropriately shield the pyroelectric element of the detector 270b from the RF signals generated by the control module. The opening 292b of the shield 290b may define an area $A_{SH}$ that falls within the area of the opening 272b of the housing 271b of the detector 270b (e.g., to decrease the size of the opening, such as the planar area of the opening). The area $A_{SH}$ of the opening 292b of the shield 290b may be smaller than the area $A_{DET}$ of the opening 272b of the housing 271b of the detector 270. For example, the opening 292b may be a circular opening as shown in FIG. 14 (e.g., to reshape the opening 272b). The opening 292b may have a diameter $D_{CIR}$ that may be sized to block RF signals in a similar manner as the opening 272 of the detector 270 shown in FIGS. 12 and 13. The diameter $D_{CIR}$ of the opening 292b may be sized to set the cutoff frequency $f_C$ be larger than the transmission frequency $f_{TX}$ (e.g., $D_{CIR}=0.586 \cdot c/f_C$). For example, when the transmission frequency $f_{TX}$ is approximately 2.4 GHZ, the diameter $D_{CIR}$ of the opening 292b of the shield 290b may be approximately 4 millimeters, which may be approximately 1/30 of the transmission wavelength $\lambda_{TX}$ at the transmission frequency $f_{TX}$ and may result is a value of the cutoff frequency $f_C$ of approximately 44 GHz. For example, the diameter $D_{CIR}$ of the opening 292b may be between approximately 1/20 and 1/50 of the transmission wavelength $\lambda_{TX}$ at the transmission frequency $f_{TX}$. In addition, the opening 292b of the shield 290b may be rectangularly-shaped, e.g., such as square-shaped as shown in FIG. 13 (e.g., to decrease the size of the opening, such as the planar area of the opening).

Figure 15:
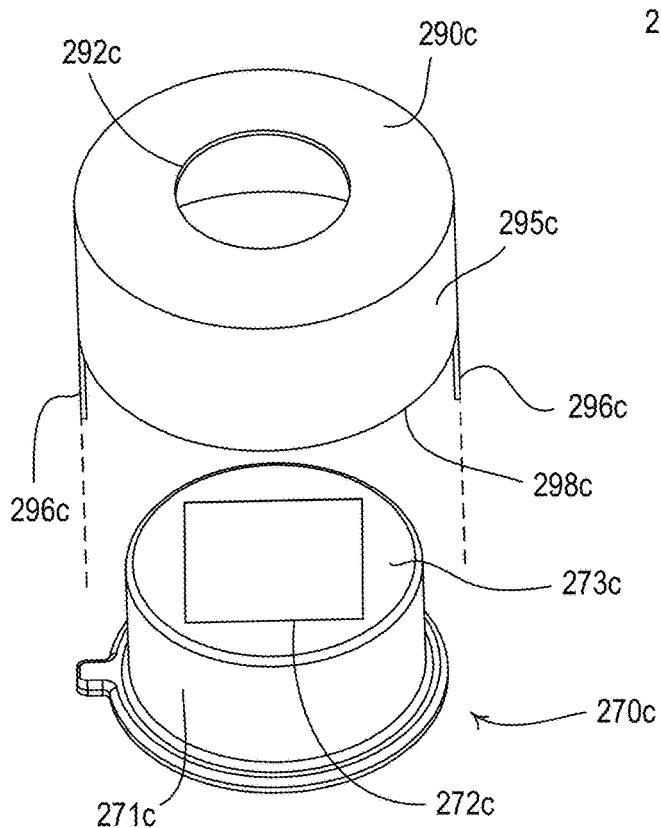

FIG. 15 is a perspective view of another detector 270c that may be used in a control module (e.g., the control module 200). For example, the detector 270c may have a housing 271c (e.g., a cylindrical housing) having an opening 271c through which the infrared energy may be received by one or more pyroelectric elements of the detector 270c. The opening 272c may be located in a front surface 273c of the housing 271c. The housing 271c and the opening 272c in the housing 271c may be centrally located along a central axis of the control module (e.g., such as the housing 271 and the opening 272 of the housing 271 are centered along the central axis 211 of the control module 200). The housing 271c may be made of, for example, a non-conductive material, such as plastic. While the opening 272c is shown as being rectangularly shaped in FIG. 15, the opening 272c may also be circularly shaped (e.g., as with the opening 272 of the detector 270 shown in FIG. 12).

The detector 270c may be surrounded by a shield 290c (e.g., even though the shield 290c is shown above the detector 270c in FIG. 15). The shield 290c may comprise an opening 292c that may be located over the front surface 273c of the housing 271c with the opening 292c overlayed over the top of the opening 272c of the housing 271c to shield the pyroelectric element of the detector 270c from the RF signals generated by the control module (e.g., in a similar manner as the shield 290b with the opening 292b shields the detector 270b). The shield 290c may comprise a sidewall 296c (e.g., a cylindrical sidewall) that may surround the housing 271c of the detector 270c. The shield 290c, and may comprise one or more projections 296c (e.g., tabs and/or posts) that extend from a lower edge 298c of the sidewall 295c. The projections 296c may be made of a conductive material, and may be attached to circuit common on the control module, such that the shield 290c may also be electrically coupled to circuit common. For example, the projections 296c may be received in through-holes in a printed circuit board on which the detector 270c is mounted (e.g., the first printed circuit board 261) and may be soldered to electrical pads surrounding the through-holes for electrically coupling the shield 290c to circuit common. In addition, the projections 296c may each extend from the sidewall 295c in a perpendicular direction (e.g., perpendicular to the sidewall 295c) and/or may each be bent at approximately a right angle, such that the projections 296c may be soldered to electrical pads on the printed circuit board (e.g., the first printed circuit board 261).

The opening 292c of the shield 290c may be sized to shield the pyroelectrical elements of the detector 270c from the RF signals generated by the control module (e.g., in a similar manner as the opening 292b in the shield 290b is sized) when the shield 290c is surrounding the housing 271c of the detector 270c (e.g., the shield 290c is mechanically and electrically coupled to the printed circuit board). In addition, the opening 292c of the shield 290c may be rectangularly-shaped, e.g., such as square-shaped as shown in FIG. 13 (e.g., to decrease the size of the opening, such as the planar area of the opening).

Figure 16A:
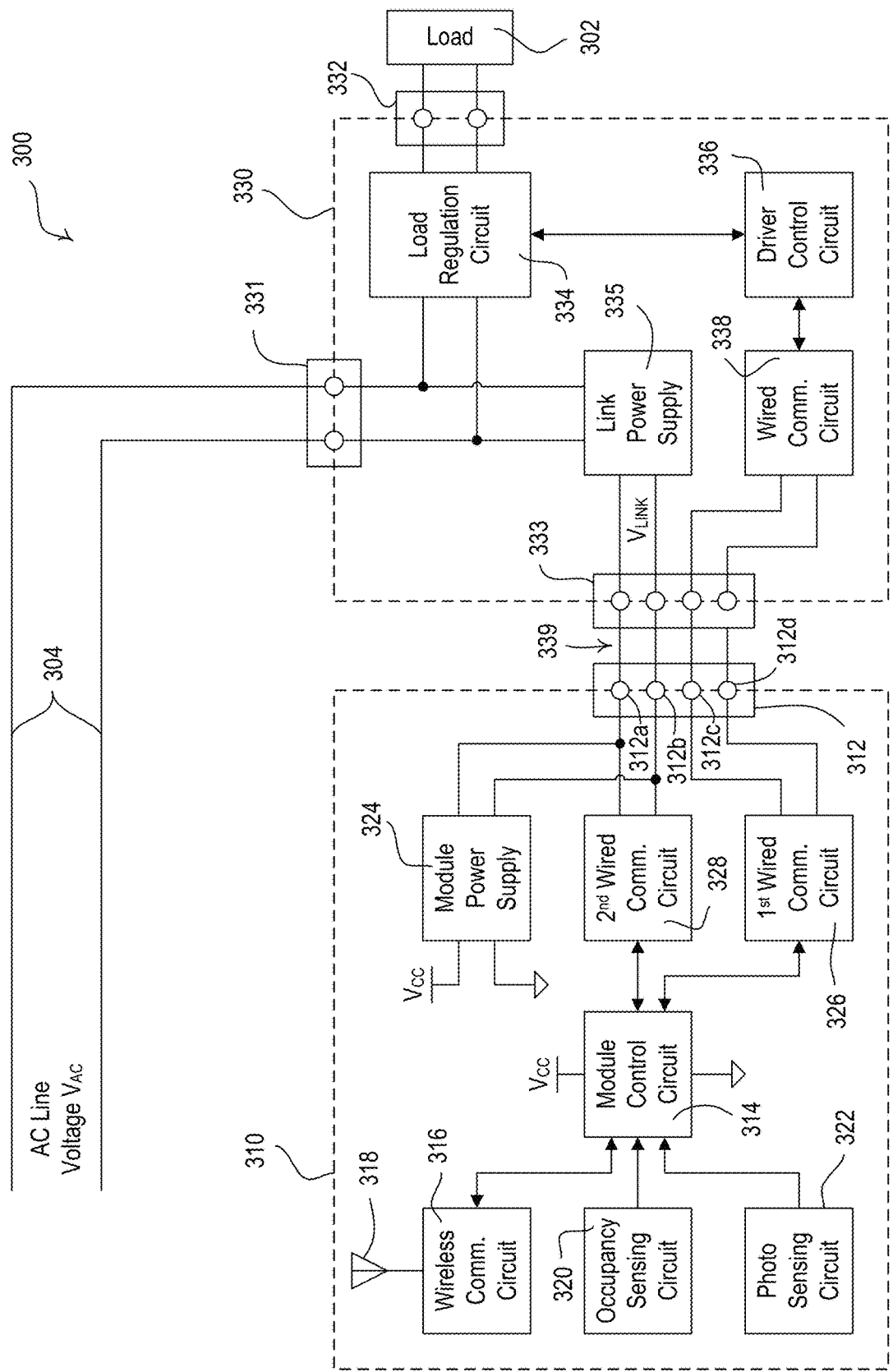
FIGS. 16A and 16B are block diagrams of an example load control system in first and second configurations, respectively.
Figure 16B:
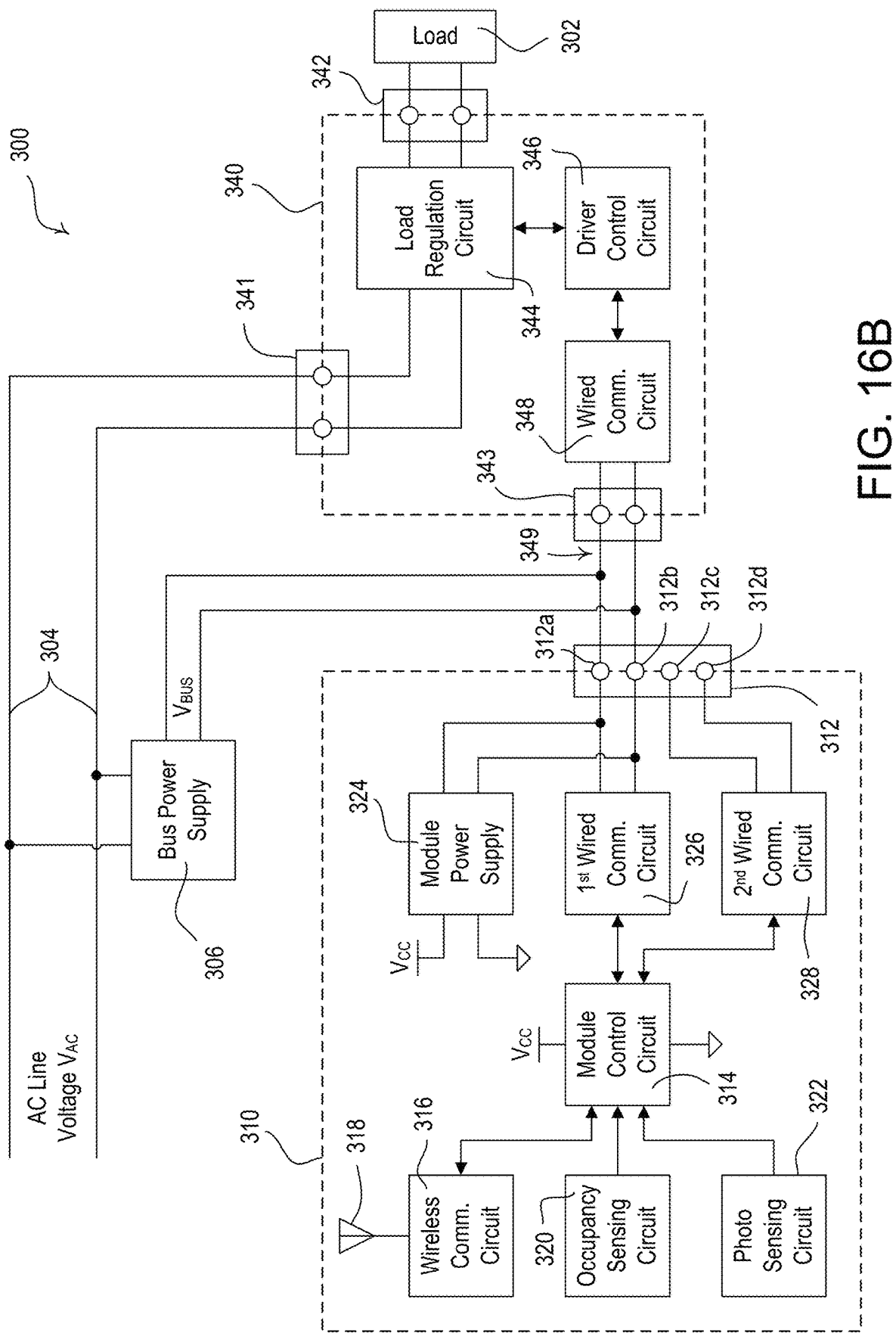

FIGS. 16A and 16B are block diagrams of an example load control system 300 in first and second configurations, respectively. The load control system 300 may comprise a control module 310 (e.g., a sensor device), which may be deployed as the control modules 120a-120d of the load control system 100 shown in FIG. 1 and/or the control module 200 shown in FIGS. 2-12. In addition, the load control system 300 may comprise a first load regulation device, such as a first lighting control device 330, in the first configuration (e.g., as shown in FIG. 16A) and a second load regulation device, such as a second lighting control device 340, in the second configuration (e.g., as shown in FIG. 16B). The first and second lighting control devices 330, 340 may be LED drivers and may be examples of the lighting control devices of the lighting control devices of the lighting fixtures 110a-110d of the load control system 100 of FIG. 1. The first and second lighting control devices 330, 340 may be electrically coupled to an alternating-current (AC) power source (not shown) via power wires 304 for receiving an AC mains lines voltage $V_{AC}$ from the AC power source. The first and second lighting control devices 330, 340 may each be configured to control an amount of power delivered from the AC power source to an electrical load, such as a lighting load 302 (e.g., an LED light source). The lighting load 302 and the control module 310 may be configured to be installed in and/or onto a lighting fixture (e.g., one of the lighting fixtures 110a-110d shown in FIG. 1 and/or the lighting fixture 202 shown in FIG. 2) along with the first lighting control device 370 in the first configuration and the second lighting control device 380 in the second configuration.

The control module 310 may comprise a control connector 312 (e.g., the connector 250 of the sensor module 200 shown in FIGS. 2-12) configured to be electrically connected to the first lighting control device 330 in the first configuration and the second lighting control device 340 in the second configuration. For example, the module connector 312 of the control module 310 may comprise four electrical terminals (e.g., the electrical terminals 252, 254). The control module 310 may be configured to receive power via the control connector 312 for powering the electrical circuitry of the control module 310. The control module 310 may also be coupled to the first lighting control device 330 and/or the second lighting control device 340 via the control connector 312.

The control module 310 may comprise a module control circuit 314 for controlling the operation of the control module 310. For example, the module control circuit 314 may comprise one or more of a processor (e.g., a microprocessor), a microcontroller, a programmable logic device (PLD), a field programmable gate array (FPGA), an application specific integrated circuit (ASIC), or any suitable controller or processing device. The control module 310 may also include a memory (not shown). The memory may be communicatively coupled to the module control circuit 314 for the storage and/or retrieval of, for example, operational settings of the control module 310. In addition, the memory may be configured to store software for execution by the module control circuit 314 to operate the control module 310. The memory may be implemented as an external integrated circuit (IC) and/or as an internal circuit of the module control circuit 314.

The control module 310 may comprise a wireless communication circuit 316 configured to communicate with control devices of the load control system via wireless signals, such as RF signals (e.g., the RF signals 104, 105 shown in FIG. 1). The wireless communication circuit 316 may include for example, one or more radio-frequency (RF) transceivers coupled to an antenna 318 (e.g., the antenna 280) for communicating (e.g., transmitting and/or receiving) the RF signals. The wireless communication circuit 316 may also include one or more of an RF transmitter for transmitting RF signals and/or an RF receiver for receiving RF signals. The wireless communication circuit 316 may be configured to communicate (e.g., transmit and/or receive) messages (e.g., digital messages) via the RF signals. For example, the wireless communication circuit 316 may be configured to transmit and/or receive messages on a first wireless communication link using a first wireless protocol (e.g., via the RF signals 104 on the wireless network communication link using the wireless network communication protocol), and on a second wireless communication link using a second wireless protocol (e.g., via the RF signals 105 on the short-range wireless communication link using the short-range wireless communication protocol). For example, the wireless communication circuit 316 may comprise a single RF transceiver configured to communicate on the wireless network communication link and the short-range wireless communication link, or multiple (e.g., two) RF transceivers, such as a first RF transceiver for communicating on the wireless network communication link and a second RF transceiver for communicating on the short-range wireless communication link. The messages received by the module control circuit 315 via the RF signals may include configuration data for configuring the control module 310 and/or control data (e.g., commands) for controlling the lighting load 302. The configuration data and/or control data may include identification information (e.g., such as a unique identifier) associated with the control module 310. While shown separately from the module control circuit 314 in FIGS. 16A and 16B, the wireless communication circuit 316 may also be implemented as an internal circuit of the module control circuit 314.

The control module 300 may comprise an occupancy sensing circuit 320 configured to sense (e.g., detect) an occupancy and/or vacancy condition in the vicinity of the lighting fixture in which the control module 300 is installed (e.g., in the room 102). The occupancy sensing circuit 320 may comprise a detector (e.g., the detector 270) for detecting an occupancy and/or vacancy condition in the space. For example, the occupancy sensing circuit 320 may comprise a passive infrared (PIR) sensing circuit, where the detector is a pyroelectric detector. In addition, the detector may comprise one or more of an ultrasonic detector, and/or a microwave detector. For example, a pyroelectric detector may be configured to receive infrared energy from an occupant in the space below the control module 200 (e.g., below the lighting fixture) through a lens (e.g., the lens 222 shown in FIGS. 2-10) to thus sense the occupancy condition in the space. The module control circuit 314 may be configured to determine a vacancy condition in the space after a timeout period expires since the last occupancy condition was detected. The module control circuit 314 may be configured to control the first and/or second lighting control device 330, 340 to turn the lighting load 304 on and off and to adjust the intensity level of the lighting load 304 in response to the occupancy sensing circuit 320 detecting occupancy and/or vacancy conditions.

The control module 300 may further comprise a photosensing circuit 322 configured to measure a light level (e.g., an ambient light level and/or a daylight level) in the vicinity of the lighting fixture in which the control module 300 is installed (e.g., in the room 102). The photo-sensing circuit 322 may comprise a photosensor (e.g., the photosensor 274) for measuring the light level in the space. For example, the photosensor may be configured to receive light from the space below the control module 200 (e.g., below the lighting fixture) through the lens (e.g., the lens 222) to thus measure the light level in the space. The module control circuit 314 may be configured to control the first and/or second lighting control device 330, 340 to turn the lighting load 304 on and off and to adjust the intensity level of the lighting load 304 in response to the light level measured by the photo-sensing circuit 322.

The control module 310 may one or more circuits coupled to the control connector 312 for receiving power and/or controlling the first and/or second lighting control devices 330, 340 (e.g., depending on whether the load control system 300 is in the first configuration or the second configuration as will be described in greater detail below). The control module 310 may comprise a module power supply 324 (e.g., an internal power supply) configured to receive power via the electrical terminals 312a, 312b of the control connector 312 and generate a direct-current (DC) module supply voltage $V_{CC}$ for powering the module control circuit 314, the wireless communication circuit 316, the occupancy sensing circuit 320, the photo-sensing circuit 322, and/or other electrical circuitry of the control module. The control module 310 may comprise a first wired communication circuit 326 which may be coupled to two electrical terminals 312c, 312d of the control connector 312 and may be used to communicate with the first lighting control device 330 in the first configuration. The control module 310 may comprise a second wired communication circuit 328 which may be coupled to the electrical terminals 312a, 312b of the control connector 312 and may be used to communicate with the second lighting control device 340 in the second configuration.

When the load control system 300 is in the first configuration as shown in FIG. 16A, the control module 310 may be coupled to the first lighting control device 330 via a four-wire control link 339. The first lighting control device 330 may comprise a power connector 331 configured to be electrically coupled to the AC power source via the power wires 304 for receiving the AC mains lines voltage $V_{AC}$ and a load connector 332 configured to be electrically coupled to the lighting load 302. The first lighting control device 330 may also comprise a control connector 333 that may be configured to be electrically coupled to the control module 310 via the four-wire control link 339. For example, the control connector 333 of the first lighting control device 330 may comprise four electrical terminals as shown in FIG. 16A.

The first lighting control device 330 may comprise a load regulation circuit 334 (e.g., an LED drive circuit) that may be coupled between the power connector 331 and the load connector 332 and may be configured to control the amount of power delivered to the lighting load 302. The first lighting control device 330 may comprise a module power supply 335 coupled to receive the AC mains line voltage $V_{AC}$ via the power connector 331 and generate a link supply voltage $V_{LINK}$ for powering the control module 310 via the control connector 333. The module power supply 324 of the control module 310 may receive the link supply voltage $V_{LINK}$ via the electrical terminals 312a, 312b of the control connector 312.

The first lighting control device 330 may comprise a driver control circuit 336 configured to control the load regulation circuit 334 to adjust the amount of power delivered to the lighting load 302 to adjust an intensity level of the lighting load. The first lighting control device 330 may further comprise a wired communication circuit 338 configured to be coupled to the control module 310 via the control connector 333 (e.g., the four-wire control link 339). The wired communication circuit 338 of the first lighting control device 330 may be coupled to the first wired communication circuit 326 of the control module 310 via the electrical terminals 312c, 312d of the control connector 312. The first wired communication circuit 326 of the control module 310 may be configured to generate, for example, an analog control signal, such as a 0-10V control signal, at the electrical terminals 312c, 312d of the control connector 312. For example, the first wired communication circuit 326 of the control module 310 may comprise a current sink circuit configured to draw current from the wired communication circuit 338 of the first lighting control device 330 to generate the 0-10V control signal at the electrical terminals 312c, 312d of the control connector 312. The driver control circuit 336 of the first lighting control device 330 may be configured to adjust the intensity level of the lighting load 304 in response to a magnitude of the analog control signal received by the wired communication circuit 338. Alternatively or additionally, the first wired communication circuit 326 of the control module 310 may be configured to transmit messages (e.g., digital messages) to the wired communication circuit 338 of the first lighting control device 330 according to a digital communication protocol. For example, the first wired communication circuit 326 of the control module 310 and the wired communication circuit 338 of the first lighting control device 330 may comprise RS-485 communication circuits. The driver control circuit 336 of the first lighting control device 330 may be configured to adjust the intensity level of the lighting load 304 in response to control data (e.g., commands) included in the messages received by the wired communication circuit 338. When the control module 310 is wired to the first lighting control device 330 in the first configuration, the module control circuit 314 of the control module 310 may be configured to disable the second wired communication circuit 328.

When the load control system 300 is in the second configuration as shown in FIG. 16B, the control module 310 may be coupled to the second lighting control device 340 via a two-wire control link 349. The second lighting control device 340 may comprise a power connector 341 configured to be electrically coupled to the AC power source via the power wires 304 for receiving the AC mains lines voltage $V_{AC}$ and a load connector 342 configured to be electrically coupled to the lighting load 302. The second lighting control device 340 may also comprise a control connector 343 that may be configured to be electrically coupled to the control module 310 via the four-wire control link 349. For example, the control connector 343 of the first lighting control device 340 may comprise two electrical terminals as shown in FIG. 16B.

The second lighting control device 340 may comprise a load regulation circuit 344 (e.g., an LED drive circuit) that may be coupled between the power connector 341 and the load connector 342 and may be configured to control the amount of power delivered to the lighting load 302. The second lighting control device 340 may comprise a driver control circuit 346 configured to control the load regulation circuit 344 to adjust the amount of power delivered to the lighting load 302 to adjust the intensity level of the lighting load. The second lighting control device 340 may further comprise a wired communication circuit 348 configured to be coupled to the control module 310 via the control connector 343 (e.g., the two-wire control link 339). The wired communication circuit 348 of the first lighting control device 340 may be coupled to the second wired communication circuit 328 of the control module 310 via the electrical terminals 312a, 312b of the control connector 312. The second wired communication circuit 328 of the control module 310 may be configured to transmit messages (e.g., digital messages) to the wired communication circuit 348 of the first lighting control device 340 according to a digital communication protocol, e.g., such as the Digital Lighting Control Interface (DALI) protocol. The driver control circuit 346 of the second lighting control device 340 may be configured to adjust the intensity level of the lighting load 304 in response to control data (e.g., commands) included in the messages received by the wired communication circuit 348.

In the second configuration, the control module 310 may be configured to receive power from the two-wire control link 349 via the electrical terminals 312a, 312b of the control connector 312 (e.g., the two-wire control link 349 may be a dual-purpose power and communication link), and the electrical terminals 312c, 312d of the control connector 312 may remain unconnected. The second lighting control device 340 may not comprise a module power supply for powering the control module 310. For example, the lighting control system 300 may comprise a bus power supply 306 in the second configuration. The bus power supply 306 may be configured to receive the AC mains line voltage $V_{AC}$ from the AC power source and generate a bus voltage $V_{BUS}$, which may be electrically coupled to the two-wire control link 349 (e.g., the electrical terminals 312a, 312b of the control connector 312) to provide for communications on the two-wire control link 349 as well as to power the control module 310. The bus power supply 306 may be external to the lighting fixture on which the control module 310 is installed and/or may be included in the lighting fixture in which the control module 310 is installed. The module power supply 324 of the control module 310 may receive the bus voltage $V_{BUS}$ via the electrical terminals 312a, 312b of the control connector 312 (e.g., when the second wired communication circuit 326 of the control module 310 and/or the wired communication circuit 348 of the second lighting control device 340 are not transmitting messages on the two-wire control link 349). Additionally and/or alternatively, the bus power supply 306 may be included in the second lighting control device 340.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure.

What is claimed is:

1. A control module comprising:
an enclosure having an enclosure opening at a first end;
a cover portion connected to the enclosure and covering the enclosure opening, the cover comprising an aperture in which a lens is located;
an antenna located within the cover portion;
a wireless communication circuit electrically coupled to the antenna for transmitting wireless signals at a transmission frequency;
a detector positioned to receive infrared energy through the lens of the cover portion, the detector comprising one or more pyroelectric elements that are responsive to the infrared energy and a housing having a front surface with a first opening through which the pyroelectric elements receive the infrared energy;
a control circuit electrically coupled to the wireless communication circuit and the detector, the control circuit configured to detect at least one of an occupancy condition or a vacancy condition in a space surrounding the control module in response to the infrared energy received through the first opening of the detector; and
a shield located over the front surface of the housing of the detector and electrically coupled to a circuit common of the control module, the shield having a second opening arranged overtop of the first opening of the housing, the second opening of the shield being sized to shield the pyroelectric elements from the wireless signals transmitted by the antenna in response to the wireless communication circuit.

2. The control module of claim 1, wherein the enclosure defines a central axis of the control module that extends in a longitudinal direction, and the aperture of the cover portion, the lens, and the detector are centered along the central axis of the control module.

3. The control module of claim 2, further comprising:
a printed circuit board on which the control circuit and the wireless communication circuit are mounted, the printed circuit board extending through the enclosure in the longitudinal direction.

4. The control module of claim 3, wherein antenna comprises first and second antenna elements electrically coupled to the wireless communication circuit in a dipole antenna configuration, each of the first and second antenna elements extending from the printed circuit board to respective curved portions that are positioned between the cover portion and the enclosure, the respective curved portions curving around the detector.

5. The control module of claim 4, wherein the curved portions of the first and second antenna elements each comprise a circular segment having a center aligned with the central axis of the control module.

6. The control module of claim 5, wherein the first and second antenna elements comprise respective elongated portions extending in the longitudinal direction from the printed circuit board and through the enclosure opening of the enclosure.

7. The control module of claim 6, wherein the first and second antenna elements comprise respective offset portions extending between the respective elongated portions and respective curved portions, the offset portions configured such that the curved portions are located farther away from the central axis than the elongated portions, the elongated portions extending parallel to each other between the printed circuit board and the respective offset portions.

8. The control module of claim 5, wherein the respective curved portions of the first and second antenna elements define respective inner edges that extend along a circular path that has a center at the central axis of the control module, and wherein an area of the first opening of the detector is located within and area of the circular path of the first and second antenna elements.

9. The control module of claim 3, wherein the control printed circuit board comprises one or more first attachment tabs extending from sides of the control printed circuit board, the one or more first attachment tabs configured to attach the control printed circuit board to a fabrication panel during manufacturing of the control module, and wherein, after the control printed circuit board is detached from the fabrication panel, the one or more first attachment tabs are configured to be received within gaps in the enclosure of the control module to align the control printed circuit board within the enclosure.

10. The control module of claim 1, further comprising:
a printed circuit board on which the detector is mounted;
wherein the shield comprises a sidewall surrounding the housing of the detector and projections that extend from the sidewall and are configured to be electrically coupled to the circuit common of the control module on the printed circuit board.

11. The control module of claim 10, wherein the projections extend from a lower edge of the sidewall, the projections configured to be received in through-holes in the printed circuit board and electrically coupled to electrical pads surrounding the through-holes for electrically coupling the shield to the circuit common of the control module.

12. The control module of claim 10, wherein the projections extend perpendicularly from the sidewall and are configured to be electrically coupled to electrical pads on the printed circuit board for electrically coupling the shield to the circuit common of the control module.

13. The control module of claim 1, wherein the housing of the detector is electrically conductive and is coupled to the circuit common of the control module, and the shield comprises a conductive material electrically coupled to the housing of the detector.

14. The control module of claim 13, wherein the conductive shield comprises a conductive adhesive for electrically coupling the shield to the housing of the detector.

15. The control module of claim 1, wherein the detector is located relative to the antenna such that energy of the wireless signals transmitted by the antenna is at a maximum level.

16. The control module of claim 15, wherein a transmit power of the wireless communication circuit and the antenna is greater than 10 dBm.

17. The control module of claim 1, wherein the second opening of the shield is circularly-shaped and has a diameter between approximately 1/20 and 1/50 of a wavelength of the wireless signals at the transmission frequency.

18. The control module of claim 1, wherein the second opening of the shield is rectangularly-shaped and the longest dimension of the second opening has a length that is between approximately 1/20 and 1/50 of a transmission wavelength of the wireless signals at the transmission frequency.

19. The control module of claim 1, wherein an area of the second opening of the shield is smaller than an area of the first opening of the housing.

20. The control module of claim 1, wherein the control module is configured to be mounted in a fixture opening of a housing of a lighting fixture, the enclosure configured to be received in the fixture opening of the lighting fixture and comprising first and second clips located adjacent to each other and configured to mount the control module within the fixture opening, each of the first and second clips comprising a plurality of teeth configured to engage a structure surrounding the fixture opening; and wherein the teeth of the first and second clips are staggered relative to each other, such that one tooth of the first clip or the second clip is configured to engage the fixture opening at a single time.

* * * * *